(12) United States Patent
Ko et al.

(10) Patent No.: US 12,451,456 B2
(45) Date of Patent: Oct. 21, 2025

(54) SEMICONDUCTOR PACKAGE INCLUDING NON-CONDUCTIVE FILM AND METHOD FOR FORMING THE SAME

(71) Applicant: Samsung Electronics Co., Ltd., Suwon-si (KR)

(72) Inventors: Yeongbeom Ko, Cheonan-si (KR); Wooju Kim, Asan-si (KR); Heejae Nam, Asan-si (KR); Jungseok Ryu, Asan-si (KR); Haemin Park, Asan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/659,400

(22) Filed: May 9, 2024

(65) Prior Publication Data
US 2024/0297141 A1    Sep. 5, 2024

Related U.S. Application Data

(63) Continuation of application No. 17/537,994, filed on Nov. 30, 2021, now Pat. No. 12,015,005.

(30) Foreign Application Priority Data

Jun. 25, 2021  (KR) .......................... 10-2021-0083093

(51) Int. Cl.
*H01L 23/00* (2006.01)
*H01L 25/065* (2023.01)
*H01L 25/18* (2023.01)

(52) U.S. Cl.
CPC .......... *H01L 24/32* (2013.01); *H01L 25/0657* (2013.01); *H01L 24/73* (2013.01);
(Continued)

(58) Field of Classification Search
CPC ......... H01L 24/32; H01L 24/73; H01L 24/31; H01L 24/11; H01L 24/14; H01L 25/0657;
(Continued)

(56) References Cited

U.S. PATENT DOCUMENTS 6,351,028 B1    2/2002  Akram
6,759,745 B2    7/2004  Masumoto et al.
(Continued)

FOREIGN PATENT DOCUMENTS

JP    2001-274295 A    10/2001
JP    2004-303992 A    10/2004
(Continued)

OTHER PUBLICATIONS

Office Action issued May 27, 2025 in corresponding Korean Application No. 10-2021-0083093.

*Primary Examiner* — Jasmine J Clark
(74) *Attorney, Agent, or Firm* — Harness, Dickey & Pierce, P.L.C.

(57) ABSTRACT

A semiconductor package includes a semiconductor chip on a substrate. The semiconductor chip includes an active region, and a scribe lane in continuity with an edge of the active region. A non-conductive film (NCF) is between the substrate and the semiconductor chip, the non-conductive film (NCF) at least partially defines a recess region overlapping with the scribe lane in plan view and extending on the active region.

20 Claims, 18 Drawing Sheets

(52) U.S. Cl.
CPC .... *H01L 25/18* (2013.01); *H01L 2224/32057* (2013.01); *H01L 2224/32058* (2013.01); *H01L 2224/32145* (2013.01); *H01L 2224/73204* (2013.01); *H01L 2225/06513* (2013.01); *H01L 2924/10156* (2013.01)

(58) Field of Classification Search
CPC .................. H01L 25/50; H01L 25/105; H01L 2224/32057; H01L 2224/32058; H01L 2224/32145; H01L 2224/73204; H01L 2224/32059; H01L 2224/3207; H01L 2225/06513; H01L 2225/06517; H01L 2225/06541; H01L 23/49572; H10B 80/00
USPC ......................................................... 257/620
See application file for complete search history.

(56) References Cited

U.S. PATENT DOCUMENTS

| | | | |
|---|---|---|---|
| 7,675,153 | B2 * | 3/2010 | Kurosawa ............... H01L 24/27 257/723 |
| 7,691,726 | B2 | 4/2010 | Seng |
| 9,048,331 | B2 | 6/2015 | Oi et al. |
| 9,768,098 | B2 * | 9/2017 | Lohia .................... H01L 21/565 |
| 10,403,603 | B2 | 9/2019 | Park et al. |
| 2014/0225230 | A1 | 8/2014 | Kim |
| 2014/0295620 | A1 | 10/2014 | Ito et al. |
| 2017/0005075 | A1 | 1/2017 | Lee et al. |

FOREIGN PATENT DOCUMENTS

| | | |
|---|---|---|
| KR | 10-2018-0067973 A | 6/2018 |
| KR | 2019-0136459 A | 12/2019 |

* cited by examiner

SEMICONDUCTOR PACKAGE INCLUDING NON-CONDUCTIVE FILM AND METHOD FOR FORMING THE SAME

CROSS-REFERENCE TO RELATED APPLICATIONS

This is a continuation of U.S. application Ser. No. 17/537,994, filed on Nov. 30, 2021, now U.S. Pat. No. 12,015,005, which is a non-provisional patent application that claims priority under 35 U.S.C. § 119 from Korean Patent Application No. 10-2021-0083093, filed on Jun. 25, 2021, in the Korean Intellectual Property Office, the disclosure of each of which is incorporated herein by reference in its entirety.

BACKGROUND

1. Field

Some example embodiments of the inventive concepts relate to a semiconductor package including a non-conductive film and a method for manufacturing the same.

2. Description of the Related Art

In accordance with lightness, thinness, simplification, miniaturization, and multifunctionalization of an electronic device, a multi-chip package is being attempted. The multi-chip package includes an adhesive layer between chips. Physical and chemical characteristics of the adhesive layer may greatly influence performance and reliability of the multi-chip package.

SUMMARY

Some example embodiments of the inventive concepts provide a semiconductor package capable of preventing occurrence of failure caused by an adhesive layer, and a method for forming the same.

A semiconductor package according to some example embodiments of the inventive concepts may include a semiconductor chip on a substrate while including an active region, and a scribe lane in continuity with an edge of the active region. The semiconductor package may include a non-conductive film (NCF), which is between the substrate and the semiconductor chip while at least partially defining a recess region. The recess region overlaps with the scribe lane in plan view, and extends on the active region.

A semiconductor package according to some example embodiments of the inventive concepts may include a plurality of semiconductor chips on a substrate. Each semiconductor chip of the plurality of semiconductor chips may include an active region and a scribe lane in continuity with an edge of the active region. The semiconductor package may include a plurality of non-conductive films (NCFs), among the plurality of semiconductor chips and between the substrate and the plurality of semiconductor chips. The semiconductor package may include a plurality of connecting members, among the plurality of semiconductor chips and between the substrate and the plurality of semiconductor chips, and connected to the substrate and the plurality of semiconductor chips while extending in the plurality of non-conductive films (NCFs). Each non-conductive film (NCF) of the plurality of non-conductive films (NCFs) may at least partially define a separate recess region of a plurality of recess regions overlapping with at least one scribe lane of the scribe lanes of the plurality of semiconductor chips in plan view and may extend on at least one active region of the active regions of the plurality of semiconductor chips.

A semiconductor package according to some example embodiments of the inventive concepts may include a first semiconductor package on a first substrate. The semiconductor package may include a second semiconductor package on the first substrate and electrically connected to the first semiconductor package. The first semiconductor package may include a plurality of semiconductor chips on a second substrate. Each semiconductor chip of the plurality of semiconductor chips may include an active region and a scribe lane in continuity with an edge of the active region. The first semiconductor package may include a plurality of non-conductive films (NCFs) among the plurality of semiconductor chips and between the second substrate and the plurality of semiconductor chips. The first semiconductor package may include a plurality of connecting members among the plurality of semiconductor chips and between the second substrate and the plurality of semiconductor chips, and connected to the second substrate and the plurality of semiconductor chips while extending in the plurality of non-conductive films (NCFs). Each non-conductive film (NCF) of the plurality of non-conductive films (NCFs) may at least partially define a separate recess region overlapping with at least one scribe lane of the scribe lanes of the plurality of semiconductor chips in plan view and may extend on at least one active region of the active regions of the plurality of semiconductor chips.

DETAILED DESCRIPTION

Figure 1:
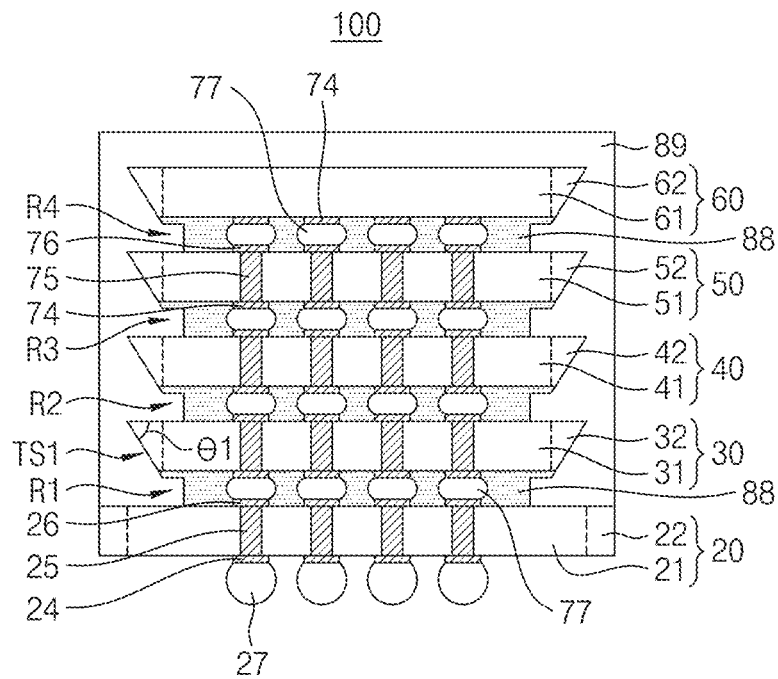
FIGS. 1, 2, 3, 4, 5, 6, 7, 8, 9, 10, 11, and 12 are sectional views explaining a first semiconductor package according to some example embodiments of the inventive concepts.

Hereinafter, detailed descriptions of the inventive concepts will be made with reference to the accompanying drawings illustrating some example embodiments of the inventive concepts by way of example. Some example embodiments will be described in detail such that the inventive concepts can be carried out by one of ordinary skill in the art. It should be understood that various example embodiments of the inventive concepts are different, but are not necessarily mutually exclusive. For example, a specific shape, structure, and characteristic of some example embodiments described herein may be implemented in other example embodiments without departing from the scope of the inventive concepts. In addition, it should be understood that a position or placement of each component in each example embodiment may be changed without departing from the scope of the inventive concepts. Accordingly, there is no intent to limit the inventive concepts to the following detailed descriptions. The scope of the inventive concepts is defined by the appended claims and encompasses all equivalents that fall within the scope of the appended claims. In the drawings, like reference numerals denote like functions, and the dimensions such as lengths, areas, and thicknesses of elements may be exaggerated for clarity.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," "vertical," "horizontal," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," "substantially vertical," and/or "substantially horizontal," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%).

Elements and/or properties thereof (e.g., structures, surfaces, directions, or the like) that are "substantially vertical" will be understood to be "vertical" (e.g., in a direction that is perpendicular to a reference element or surface, such as an upper surface of a substrate as described herein) within manufacturing tolerances and/or material tolerances and/or have a deviation in magnitude and/or angle from "vertical," or the like with regard to the other elements and/or properties thereof that is equal to or less than 10% (e.g., a. tolerance of ±10%).

Elements and/or properties thereof (e.g., structures, surfaces, directions, or the like) that are "substantially horizontal" will be understood to be "horizontal" (e.g., in a direction that is parallel to a reference element or surface, such as an upper surface of a substrate as described herein) within manufacturing tolerances and/or material tolerances and/or have a deviation in magnitude and/or angle from "horizontal," or the like with regard to the other elements and/or properties thereof that is equal to or less than 10% (e.g., a. tolerance of ±10%).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

FIGS. 1, 2, 3, 4, 5, 6, 7, 8, 9, 10, 11, and 12 are sectional views explaining a first semiconductor package 100 according to some example embodiments of the inventive concepts.

Referring to FIG. 1, the first semiconductor package 100 according to some example embodiments of the inventive concepts may include a first substrate 20, a plurality of lower pads 24, a plurality of substrate wirings 25, a plurality of upper pads 26, a plurality of outer terminals 27, a plurality of semiconductor chips 30, 40, 50 and 60, a plurality of connecting members 77, a plurality of non-conductive films (NCFs) 88, and an encapsulator 89.

The first substrate 20 may include a substrate active region 21 and a scribe lane 22. The scribe lane 22 may be in continuity with an edge of the substrate active region 21. The plurality of semiconductor chips 30, 40, 50 and 60 may include a first semiconductor chip 30, a second semiconductor chip 40, a third semiconductor chip 50, and a fourth semiconductor chip 60. Each of the first semiconductor chip 30, the second semiconductor chip 40, and the third semiconductor chip 50 may include a plurality of chip pads 74, a plurality of through electrodes 75, and a plurality of connecting pads 76. The fourth semiconductor chip 60 may include a plurality of chip pads 74. It will be understood that in some example embodiments the first semiconductor package 100 may omit at least some of the elements shown in FIG. 1. For example, in some example embodiments, semiconductor chips 40, 50 and 60 may be omitted such that a single semiconductor chip, the first semiconductor chip 30, is on the first substrate 20 with at least a non-conducting film (NCF) 88 therebetween.

The first semiconductor chip 30 may include a first active region 31 and a first scribe lane 32. The first scribe lane 32 may be in continuity with an edge of the first active region 31. Restated, the first scribe lane 32 and the first active region 31 may be separate regions of a single, unitary piece of material (e.g., a single, continuous material that extends continuously between the first active region 31 and the first scribe lane 32 without an interface therebetween), such that the first scribe lane 32 is an outer edge region of the unitary piece of material and the active region 31 is a central region of the unitary piece of material. In some example embodiments, the first semiconductor chip may include a single, unitary piece of material that at least partially comprises silicon. The semiconductor chip 40 may include a second active region 41 and a second scribe lane 42. The second scribe lane 42 may be in continuity with an edge of the second active region 41. The third semiconductor chip 50 may include a third active region 51 and a third scribe lane 52. The third scribe lane 52 may be in continuity with an edge of the third active region 51. The fourth semiconductor chip 60 may include a fourth active region 61 and the fourth scribe lane 62. The fourth scribe lane 62 may be in continuity with an edge of the fourth active region 61. It will be understood that, where a first region is described herein as being "in continuity" with an edge of a second region, the first and second regions may be separate regions of a single, unitary piece of material (e.g., a single, continuous material that extends continuously between the first and second regions without an interface therebetween).

Each of the plurality of semiconductor chips 30, 40, 50, and 60 may include a first tilt side surface TS1. The plurality of non-conductive films (NCFs) 88 may include (e.g., at least partially define) a plurality of recess regions R1, R2, R3, and R4. The plurality of recess regions R1, R2, R3, and R4 may include a first recess region R1, a second recess region R2, a third recess region R3, and a fourth recess region R4.

The first substrate 20 may include a buffer chip, an application processor, a microprocessor, a logic chip, an interposer, a printed circuit board, or any combination thereof. The plurality of substrate wirings 25 may extend into the substrate active region 21. The plurality of substrate wirings 25 may include a horizontal wiring, a vertical wiring, a through electrode, or any combination thereof. The plurality of lower pads 24 may be disposed at a bottom surface of the substrate active region 21. The plurality of lower pads 24 may contact the plurality of substrate wirings 25. The plurality of outer terminals 27 may be disposed on the plurality of lower pads 24. The plurality of upper pads 26 may be disposed at a top surface of the substrate active region 21. The plurality of upper pads 26 may contact the plurality of substrate wirings 25.

Each of the plurality of lower pads 24, the plurality of substrate wirings 25, the plurality of upper pads 26, and the plurality of outer terminals 27 may include metal, metal nitride, metal oxide, metal silicide, conductive carbon, or any combination thereof. Each of the plurality of lower pads 24, the plurality of substrate wirings 25, the plurality of upper pads 26, and the plurality of outer terminals 27 may include Ag, Al, AlN, Au, Be, Bi, Co, Cu, Hf, In, Mn, Mo, Ni, Pb, Pd, Pt, Rh, Re, Ru, Sn, Ta, TaN, Te, Ti, TiN, W, WN, Zn, Zr, or any combination thereof. Each of the plurality of lower pads 24, the plurality of substrate wirings 25, the plurality of upper pads 26, and the plurality of outer terminals 27 may include a single layer or multiple layers. In some example embodiments, the plurality of outer terminals 27 may include a conductive bump, a conductive ball, a conductive pin, a conductive lead, a conductive pillar, or any combination thereof. For example, each of the plurality of outer terminals 27 may include an under bump metal (UBM) and a conductive bump.

Each of the plurality of semiconductor chips 30, 40, 50, and 60 may include a volatile memory, a non-volatile memory, a microprocessor, a buffer chip, an application processor, a logic chip, or any combination thereof. In some example embodiments, the plurality of semiconductor chips 30, 40, 50, and 60 may include DRAM, SRAM, flash memory, EEPROM, PRAM, MRAM, RRAM, or any combination thereof.

The plurality of chip pads 74 may be disposed on one-side surfaces (for example, bottom surfaces) of the first semiconductor chip 30, the second semiconductor chip 40, the third semiconductor chip 50, and the fourth semiconductor chip 60. The plurality of through electrodes 75 may extend within the first semiconductor chip 30, the second semiconductor chip 40, the third semiconductor chip 50, and the fourth semiconductor chip 60. The plurality of connecting pads 76 may be disposed on surfaces (for example, top surfaces), opposite to the one-side surfaces, of the first semiconductor chip 30, the second semiconductor chip 40, the third semiconductor chip 50, and the fourth semiconductor chip 60.

In the fourth semiconductor chip 60, the plurality of through electrodes 75 and the plurality of connecting pads 76 may be omitted. Each of the plurality of through electrodes 75 may extend through a selected one of the first active region 31, the second active region 41, and the third active region 51. Each of the plurality of chip pads 74 and the plurality of connecting pads 76 may be disposed on a selected one of one-side surfaces (for example, bottom surfaces) and surfaces (for example, top surfaces), opposite to the one-side surfaces, of the first active region 31, the second active region 41, the third active region 51, and the fourth active region 61. The plurality of through electrodes 75 may contact the plurality of chip pads 74 and the plurality of connecting pads 76.

Each of the plurality of chip pads 74, the plurality of through electrodes 75, and the plurality of connecting pads 76 may include metal, metal nitride, metal oxide, metal silicide, conductive carbon, or any combination thereof. Each of the plurality of chip pads 74, the plurality of through electrodes 75, and the plurality of connecting pads 76 may include Ag, Al, AlN, Au, Be, Bi, Co, Cu, Hf, In, Mn, Mo, Ni, Pb, Pd, Pt, Rh, Re, Ru, Sn, Ta, TaN, Te, Ti, TiN, W, WN, Zn, Zr, or any combination thereof. Each of the plurality of chip pads 74, the plurality of through electrodes 75, and the plurality of connecting pads 76 may include a single layer or multiple layers.

The first semiconductor chip 30, the second semiconductor chip 40, the third semiconductor chip 50, and the fourth semiconductor chip 60 may be sequentially stacked on the first substrate 20. As shown in FIG. 1, the plurality of non-conductive films (NCFs) 88 may be disposed among the first semiconductor chip 30, the second semiconductor chip 40, the third semiconductor chip 50, and the fourth semiconductor chip 60 and between the first substrate 20 and the plurality of semiconductor chips 30, 40, 50, and 60. The plurality of connecting members 77 may be disposed among the first semiconductor chip 30, the second semiconductor chip 40, the third semiconductor chip 50, and the fourth semiconductor chip 60 and between the first substrate 20 and the plurality of semiconductor chips 30, 40, 50, and 60. Each of the plurality of connecting members 77 (e.g., each connecting member 77 of the plurality of connecting members 77) may extend within a selected one of the plurality of non-conductive films (NCFs) 88. For example, as shown in FIG. 1, the plurality of connecting members 77 may be connected to the first substrate 20 and the plurality of semiconductor chips 30, 40, 50, and 60 while extending in the plurality of non-conductive films (NCFs) 88. In some example embodiments, each of the plurality of connecting members 77 may extend through a selected one of the plurality of non-conductive films (NCFs) 88 and, as such, may contact a selected one of the plurality of chip pads 74 and a selected one of the plurality of upper pads 26 and the plurality of connecting pads 76.

Each of the plurality of connecting members 77 may include metal, metal nitride, metal oxide, metal silicide, conductive carbon, or any combination thereof. Each of the plurality of connecting members 77 may include Ag, Al, AlN, Au, Be, Bi, Co, Cu, Hf, In, Mn, Mo, Ni, Pb, Pd, Pt, Rh, Re, Ru, Sn, Ta, TaN, Te, Ti, TiN, W, WN, Zn, Zr, or any combination thereof. Each of the plurality of connecting members 77 (e.g., each connecting member 77 of the plurality of connecting members 77) may include a conductive bump, a conductive ball, a conductive pin, a conductive lead, a conductive pillar, or any combination thereof. For example, each of the plurality of connecting members 77 may include an under bump metal (UBM) and a conductive bump. In some example embodiments, the plurality of non-conductive films (NCFs) 88 may correspond to a die attach film (DAF). Each of the plurality of non-conductive films (NCFs) 88 may include a resin and a filler. The filler may include silica. The resin may include a thermosetting resin.

The first semiconductor chip 30 may be disposed on the first substrate 20. A selected one of the plurality of non-conductive films (NCFs) 88 may be bonded between the first semiconductor chip 30 and the first substrate 20. The plurality of connecting members 77 may be disposed to contact the plurality of upper pads 26 and the plurality of chip pads 74 while extending through a selected one of the plurality of non-conductive films (NCFs) 88. For example, a plurality of connecting members 77 may be connected to both the first substrate 20 (e.g., via upper pads 26) and the first semiconductor chip 30 (e.g., via chip pads 74) while extending in a selected one of the plurality of non-conductive films (NCFs) 88 that is between the first substrate 20 and the first semiconductor chip 30.

A top surface of the first semiconductor chip 30 may include at least a portion of the first scribe lane 32. The first semiconductor chip 30 may include the first tilt side surface TS1. The top surface of the first semiconductor chip 30 may have a greater horizontal width (e.g., width in a direction that is parallel to a surface, including the upper surface, of the first substrate 20) than a bottom surface of the first semiconductor chip 30. As shown in FIG. 1, the first tilt side surface TS1 may be defined within the first scribe lane 32 (e.g., the first tilt side surface TS1 may be partially or entirely defined by a side surface of the first scribe lane 32 which may be a tilt side surface of the first scribe lane 32). The bottom surface of the first semiconductor chip 30 may include at least a portion of the first scribe lane 32. A tilt angle θ1 formed by the top surface of the first semiconductor chip 30 and the first tilt side surface TS1 may be about 45 degrees to about 89 degrees. The first semiconductor chip 30 may include an inverted trapezoid.

The first recess region R1 may be disposed on a side surface of a selected one of the plurality of non-conductive films (NCFs) 88. Restated, the selected one of the plurality of non-conductive films (NCFs) 88, which is shown to be between the first substrate 20 and the first semiconductor chip 30, may at least partially define the first recess region R1 of the selected one of the plurality of non-conductive films (NCFs) 88. For example, the selected one of the plurality of non-conductive films (NCFs) 88 may include one or more side surfaces that at least partially define the first recess region R1, such that the first recess region is understood to be at least partially defined by at least one side surface of the selected one of the plurality of non-conductive films (NCFs) 88. The first recess region R1 may be disposed between the first semiconductor chip 30 and the first substrate 20. A selected one of the plurality of non-conductive films (NCFs) 88 may have a smaller horizontal width (e.g., width in the direction extending parallel to the upper surface of the first substrate 20 that is the proximate substrate surface to the first semiconductor chip 30) than the top surface of the first semiconductor chip 30. In some example embodiments, a selected one of the plurality of non-conductive films (NCFs) 88 may have a horizontal width equal to or smaller than that of the bottom surface of the first semiconductor chip 30. In some example embodiments, a selected one of the plurality of non-conductive films (NCFs) 88 that is between the first substrate 20 and the first semiconductor chip 30 may have a smaller horizontal width than the first semiconductor chip 30 (e.g., smaller than a smallest horizontal width of the first semiconductor chip 30). Referring to FIG. 1, each non-conductive film (NCF) 88 of the plurality of non-conductive films (NCFs) 88 may at least partially define a separate recess region of the plurality of recess regions R1, R2, R3, and R4 that overlaps (e.g., in the vertical direction) with at least one scribe lane (e.g., at least one or all of the scribe lanes 32, 42, 52, and 52) of the plurality of semiconductor chips 30, 40, 50, and 60 in plan view and extending on at least one active region (e.g., at least one or all of the active regions 31, 41, 51, and 51) of the plurality of semiconductor chips 30, 40, 50, and 60. Each separate recess region (e.g., R1), at least partially defined by one non-conductive film (NCF) 88 of the plurality of non-conductive films (NCFs) 88, may be spaced apart from connecting members 77 extending in the one non-conductive film (NCF) 88 (e.g., the non-conductive film (NCF) 88 that is between the first substrate 20 and the first semiconductor chip 30) by a distance greater than half of a minimum distance between an edge of an active region of one semiconductor chip of the plurality of semiconductor chips that is adjacent to the one non-conductive film (NCF) (e.g., an edge of the first active region 31) and the plurality of connecting members 77.

A selected one of the plurality of non-conductive films (NCFs) 88 may contact the first active region 31 in plan view. A selected one of the plurality of non-conductive films (NCFs) 88 may cover the first active region 31 in plan view. A selected one of the plurality of non-conductive films (NCFs) 88 may extend on the first scribe lane 32. For example, the non-conductive film (NCF) 88 between the first substrate 20 and the first semiconductor chip 30 may cover the first active region 31 in plan view while further extending (e.g., extending continuously as a single, unitary piece of material) on the first scribe lane 32. As shown in FIG. 1, the first tilt side surface TS1 may extend on a side surface of a selected one of the plurality of non-conductive films (NCFs) 88. Restated, the first tilt side surface TS1 may include (e.g., may be at least partially defined by) a tilt side surface of the first scribe lane 32 and a tilt side surface of the selected one of the plurality of non-conductive films (NCFs) 88 which may be coplanar with the tilt side surface of the first scribe lane 32, such that the first tilt side surface TS1 may extend continuously from a side surface of the scribe lane 32 to a side surface of the selected one of the plurality of non-conductive films (NCFs) 88. As shown in FIG. 1, each semiconductor chip of the plurality of semiconductor chips 30, 40, 50, and 60 may include a tilt side surface (e.g., the first tilt side surface TS1) that may be defined within (e.g., at least partially or completely defined by a side surface of) the scribe lane of the semiconductor chip.

As shown in FIG. 1, the first recess region R1 may overlap with the first scribe lane 32 in plan view. At least a portion of the first recess region R1 may extend on (e.g., may, as shown in FIG. 1, at least partially overlap in plan view with) the first active region 31. A selected one of the plurality of non-conductive films (NCFs) 88 (e.g., the non-conductive film (NCF) 88 between the first substrate 20 and the first semiconductor chip 30) may include a top surface adjacent to (e.g., in direct contact with) the first semiconductor chip 30, and a bottom surface adjacent to (e.g., in direct contact with) the first substrate 20. The horizontal width of the top surface of a selected one of the plurality of non-conductive films (NCFs) 88 may be greater than the horizontal width of the bottom surface of the selected one of the plurality of non-conductive films (NCFs) 88.

The first recess region R1 may be disposed to be spaced apart from (e.g., isolated from direct contact with) the plurality of connecting members 77 by a distance that is greater than half of a first minimum distance between an edge of the first active region 31 and the plurality of connecting members 77. A second minimum distance between the first recess region R1 and the plurality of connecting members 77 may be greater than half of the first minimum distance between the edge of the first active region 31 and the plurality of connecting members 77.

A selected one of the plurality of non-conductive films (NCFs) 88 may be disposed within a shadow region between the first semiconductor chip 30 and the first substrate 20. A line perpendicular to a surface of the first substrate 20 while passing an outermost side of the first semiconductor chip 30 may be spaced apart from (e.g., isolated from direct contact with) a selected one of the plurality of non-conductive films (NCFs) 88. Restated, and as shown in FIG. 1, a outermost side of the first semiconductor chip 30 (e.g., outermost edge of the first semiconductor chip 30 in a horizontal direction that is parallel to a surface, including an upper surface, of the first substrate 20) may not overlap (e.g., may be exposed from) the selected one of the plurality of non-conductive films (NCFs) 88 in plan view (e.g., in a vertical direction perpendicular to a surface, including the upper surface, of the first substrate 20). In some example embodiments, a selected one of the plurality of non-conductive films (NCFs) 88 may be disposed within a shadow region between the bottom surface of the first semiconductor chip 30 and the first substrate 20.

The second semiconductor chip 40 may be disposed on the first semiconductor chip 30. A selected one of the plurality of non-conductive films (NCFs) 88 may be bonded between the second semiconductor chip 40 and the first semiconductor chip 30. The plurality of connecting members 77 may be disposed to contact the plurality of connecting pads 76 and the plurality of chip pads 74 while extending through a selected one of the plurality of non-conductive films (NCFs) 88.

A top surface of the second semiconductor chip 40 may include at least a portion of the second scribe lane 42. The second semiconductor chip 40 may include the first tilt side surface TS1 similar to that of the first semiconductor chip 30. The top surface of the second semiconductor chip 40 may have a greater horizontal width than a bottom surface of the second semiconductor chip 40. The first tilt side surface TS1 may be defined within the second scribe lane 42. The bottom surface of the second semiconductor chip 40 may include at least a portion of the second scribe lane 42. The second semiconductor chip 40 may include an inverted trapezoid.

The second recess region R2 may be disposed on a side surface of a selected one of the plurality of non-conductive films (NCFs) 88. The second recess region R2 may be disposed between the second semiconductor chip 40 and the first semiconductor chip 30. A selected one of the plurality of non-conductive films (NCFs) 88 may have a smaller horizontal width than the top surface of the second semiconductor chip 40. In some example embodiments, a selected one of the plurality of non-conductive films (NCFs) 88 may have a horizontal width equal to or smaller than that of the bottom surface of the second semiconductor chip 40.

A selected one of the plurality of non-conductive films (NCFs) 88 may contact the first active region 31 and the second active region 41 in plan view. A selected one of the plurality of non-conductive films (NCFs) 88 may extend on the second scribe lane 42. The second recess region R2 may overlap with the first scribe lane 32 and the second scribe lane 42 in plan view. At least a portion of the second recess region R2 may overlap with the first active region 31 and the second active region 41 in plan view. A selected one of the plurality of non-conductive films (NCFs) 88) may include a top surface adjacent to the second semiconductor chip 40, and a bottom surface adjacent to the first semiconductor chip 30. The horizontal width of the top surface of a selected one of the plurality of non-conductive films (NCFs) 88 may be greater than the horizontal width of the bottom surface of the selected one of the plurality of non-conductive films (NCFs) 88.

The second recess region R2 may be disposed to be spaced apart from the plurality of connecting members 77 by a distance greater than half of a first minimum distance between an edge of the second active region 41 and the plurality of connecting members 77. A second minimum distance between the second recess region R2 and the plurality of connecting members 77 may be greater than half of the first minimum distance between the edge of the second active region 41 and the plurality of connecting members 77.

A selected one of the plurality of non-conductive films (NCFs) 88 may be disposed within a shadow region between the second semiconductor chip 40 and the first semiconductor chip 30. A line perpendicular to a surface of the first substrate 20 while passing an outermost side of the second semiconductor chip 40 may be spaced apart from a selected one of the plurality of non-conductive films (NCFs) 88. In some example embodiments, a selected one of the plurality of non-conductive films (NCFs) 88 may be disposed within a shadow region between the bottom surface of the second semiconductor chip 40 and the first semiconductor chip 30.

The third semiconductor chip 50 may be disposed on the second semiconductor chip 40. A selected one of the plurality of non-conductive films (NCFs) 88 may be bonded between the third semiconductor chip 50 and the second semiconductor chip 40. The plurality of connecting members 77 may be disposed to contact the plurality of connecting pads 76 and the plurality of chip pads 74 while extending through a selected one of the plurality of non-conductive films (NCFs) 88. The third semiconductor chip 50 may include a configuration similar to that of the second semiconductor chip 40 and, as such, no description thereof will be given for simplicity of description.

The fourth semiconductor chip 60 may be disposed on the third semiconductor chip 50. A selected one of the plurality of non-conductive films (NCFs) 88 may be bonded between the fourth semiconductor chip 60 and the third semiconductor chip 50. A configuration between the fourth semiconductor chip 60 and the third semiconductor chip 50 may include a configuration similar to a configuration between the third semiconductor chip 50 and the second semiconductor chip 40 and, as such, no description thereof will be given for simplicity of description.

As shown in FIG. 1, a top surface of each semiconductor chip of the plurality of semiconductor chips 30, 40, 50, and 60 may haves a greater horizontal width than a bottom surface of the same semiconductor chip. As further shown in FIG. 1, a tilt angle (e.g., θ1) formed by the top surface of each semiconductor chip of the plurality of semiconductor chips 30, 40, 50, and 60 and the tilt side surface (e.g., TS1) of the semiconductor chip may be about 45 degrees to about 89 degrees.

The encapsulator 89, which covers the plurality of semiconductor chips 30, 40, 50 and 60, may be disposed on the first substrate 20. For example, the encapsulator 89 may be on the first substrate 20 while covering at least one side surface of each semiconductor chip of the plurality of semiconductor chips 30, 40, 50 and 60. The encapsulator 89 may extend within the plurality of recess regions R1, R2, R3, and R4. For example, the encapsulator 89 may extend into each recess region of the plurality of recess regions R1, R2, R3, and R4. The encapsulator 89 may contact side surfaces of the plurality of non-conductive films (NCFs) 88. The encapsulator 89 may extend among the first substrate 20, the first semiconductor chip 30, the second semiconductor chip 40, the third semiconductor chip 50, and the fourth semiconductor chip 60. The encapsulator 89 may contact the substrate active region 21, the first active region 31, the second active region 41, the third active region 51, and the fourth active region 61 in plan view.

The encapsulator 89 may overlap (e.g., in a vertical direction that extends perpendicular to at least one surface of the first substrate 20 including the upper surface of the first substrate 20) with regions between the substrate active region 21 and the first active region 31, between the first active region 31 and the second active region 41, between the second active region 41 and the third active region 51, and between the third active region 51 and the fourth active region 61. For example, as shown in FIG. 1, at least a portion of the encapsulator 89 may overlap, in the vertical direction, both a portion of the first substrate 20 and a portion of the first active region 31. As further shown in FIG. 1, the encapsulator 89 may at least partially overlap with both a portion of the first substrate 20 and at least a portion of the active regions (e.g., 31, 41, 51, and 61) of the plurality of semiconductor chips 30, 40, 50, and 60. The encapsulator 89 may include an epoxy molding compound (EMC).

Figure 2:
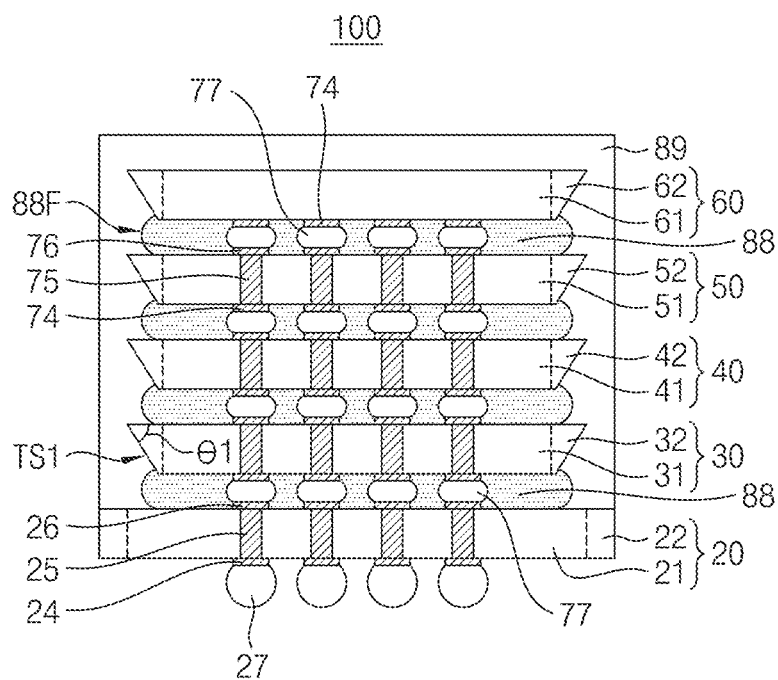

Referring to FIG. 2, each of a plurality of non-conductive films (NCFs) 88 may include a fillet 88F formed among the first substrate 20, the first semiconductor chip 30, the second semiconductor chip 40, the third semiconductor chip 50, and the fourth semiconductor chip 60. The fillet 88F may be confined within shadow regions among the first substrate 20, the first semiconductor chip 30, the second semiconductor chip 40, the third semiconductor chip 50, and the fourth semiconductor chip 60.

Figure 3:
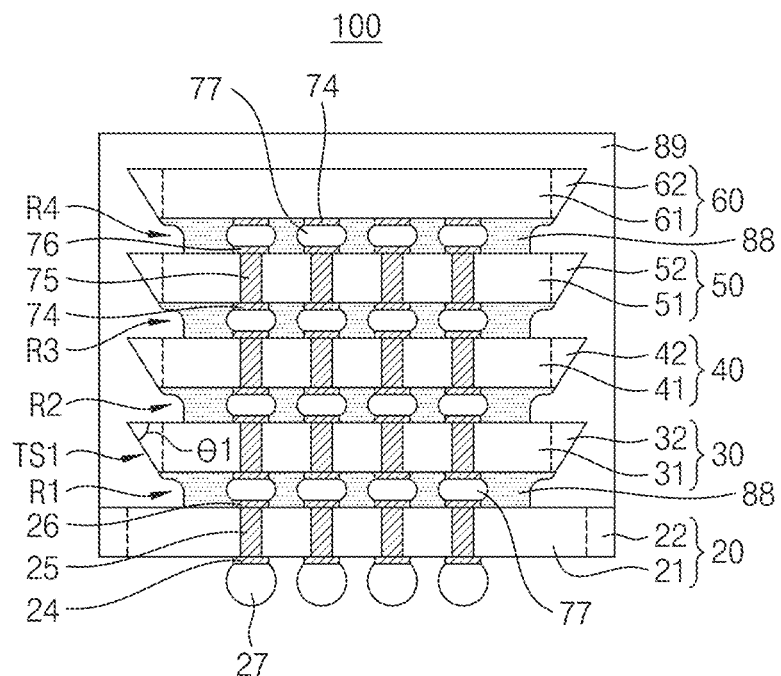

Referring to FIG. 3, each of a plurality of recess regions R1, R2, R3, and R4 may include various surface shapes. In some example embodiments, each of the plurality of recess regions R1, R2, R3, and R4 may include a concave surface.

Figure 4:
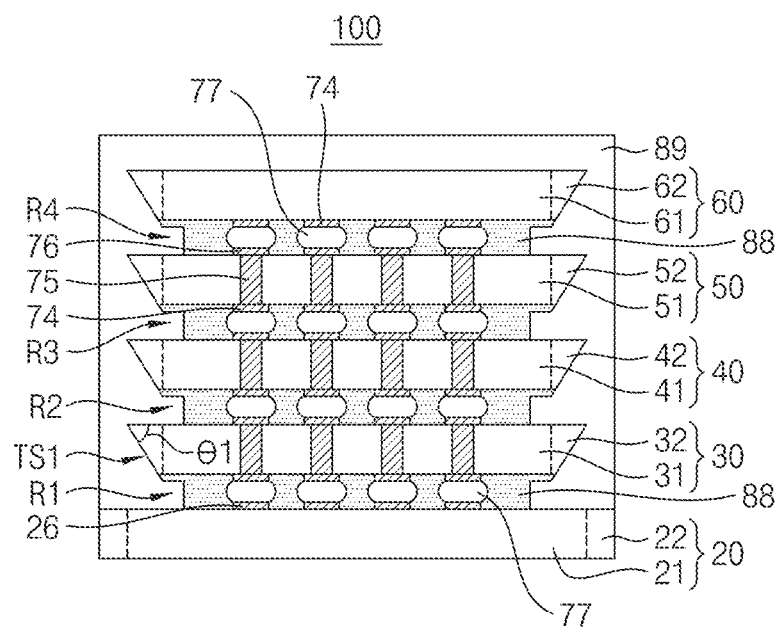

Referring to FIG. 4, a plurality of upper pads 26 may be disposed on a substrate active region 21. The plurality of outer terminals ("27" in FIG. 1) may be omitted.

Figure 5:
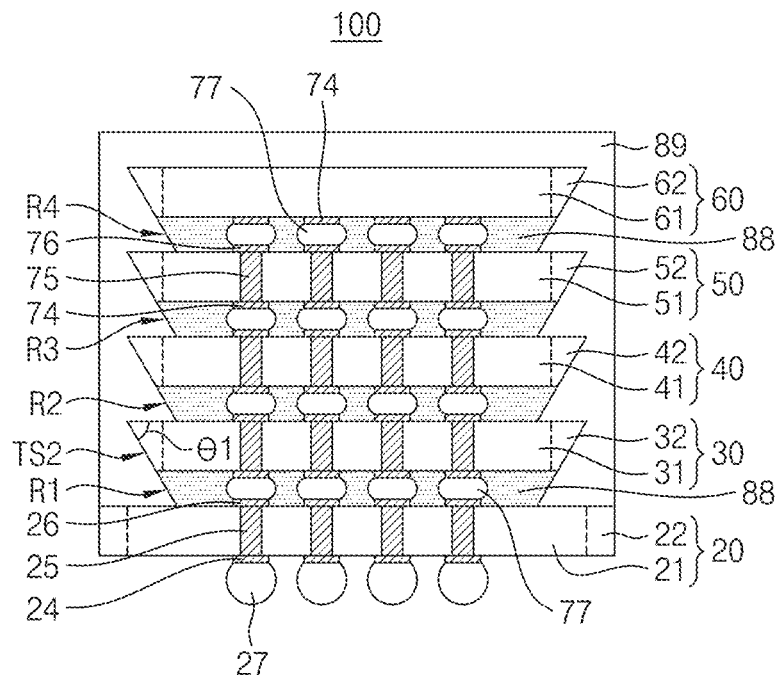

Referring to FIG. 5, each of a plurality of semiconductor chips 30, 40, 50, and 60 may include a second tilt side surface TS2. The second tilt side surface TS2 may extend on side surfaces of a plurality of non-conductive films (NCFs) 88. A tilt angle θ1 of the second tilt side surface TS2 may be about 45 degrees to about 89 degrees.

Figure 6:
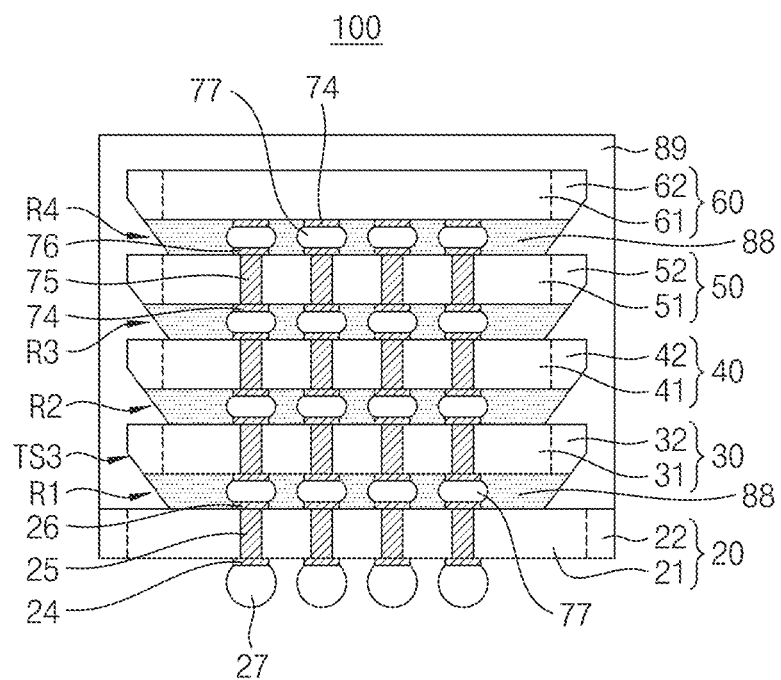

Referring to FIG. 6, each of a plurality of semiconductor chips 30, 40, 50, and 60 may include a third tilt side surface TS3. The third tilt side surface TS3 may be partially formed at a side surface of each of the plurality of semiconductor chips 30, 40, 50, and 60. The third tilt side surface TS3 may extend on side surfaces of a plurality of non-conductive films (NCFs) 88.

Figure 7:
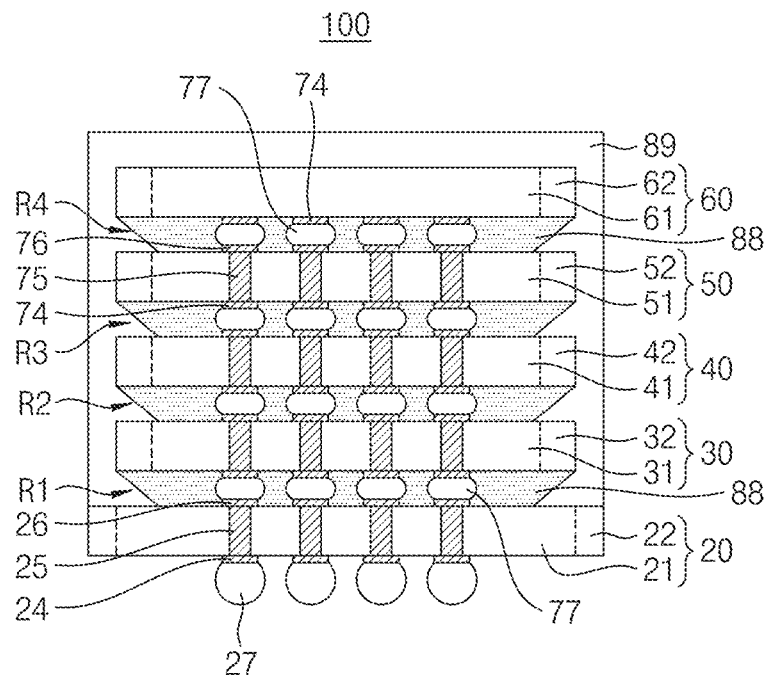

Referring to FIG. 7, each of a plurality of semiconductor chips 30, 40, 50, and 60 may include a rectangle. A side surface of each of the plurality of semiconductor chips 30, 40, 50, and 60 may be substantially perpendicular to a top surface and a bottom surface of each of the plurality of semiconductor chips 30, 40, 50, and 60. Each of a plurality of non-conductive films (NCFs) 88 may include tilt side surfaces.

Figure 8:
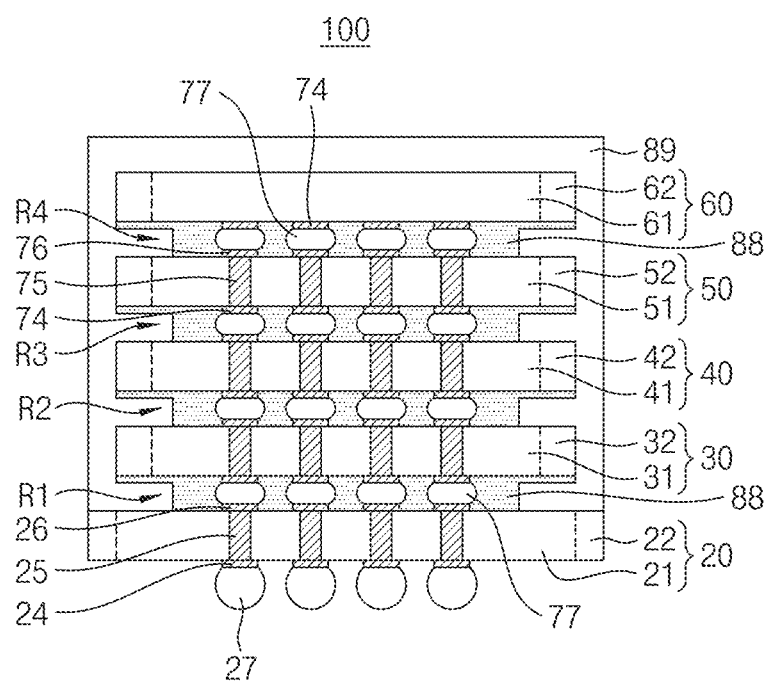

Referring to FIG. 8, a plurality of non-conductive films (NCFs) 88 may include a plurality of recess regions R1, R2, R3, and R4. Each of the plurality of recess regions R1, R2, R3, and R4 may include various surface shapes. In some example embodiments, each of the plurality of recess regions R1, R2, R3, and R4 may include a quadrangular shape or a block shape.

Figure 9:
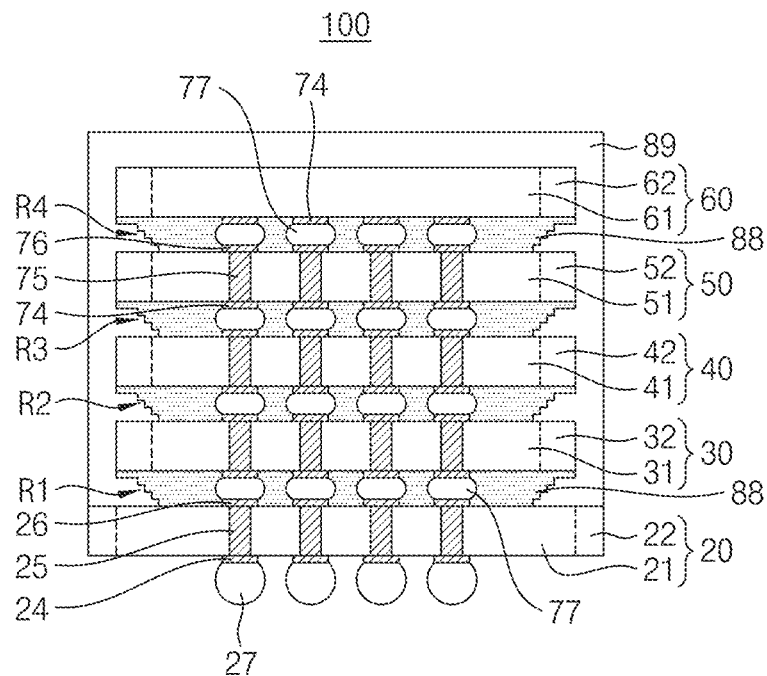

Referring to FIG. 9, each of a plurality of recess regions R1, R2, R3, and R4 may include various surface shapes. In some example embodiments, each of the plurality of recess regions R1, R2, R3, and R4 may include a staircase shape.

Figure 10:
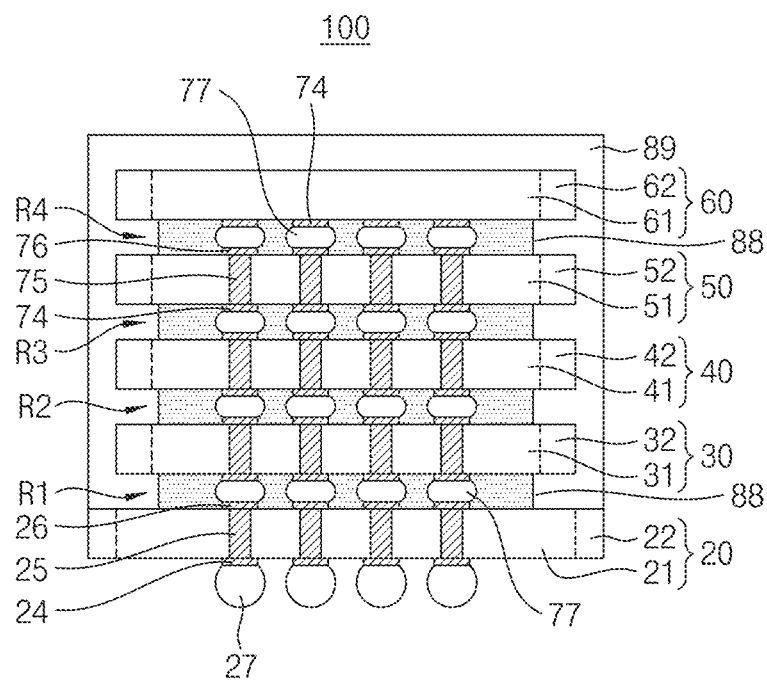

Referring to FIG. 10, each of a plurality of recess regions R1, R2, R3, and R4 may include various surface shapes. In some example embodiments, each of the plurality of recess regions R1, R2, R3, and R4 may include a vertical wall shape.

Figure 11:
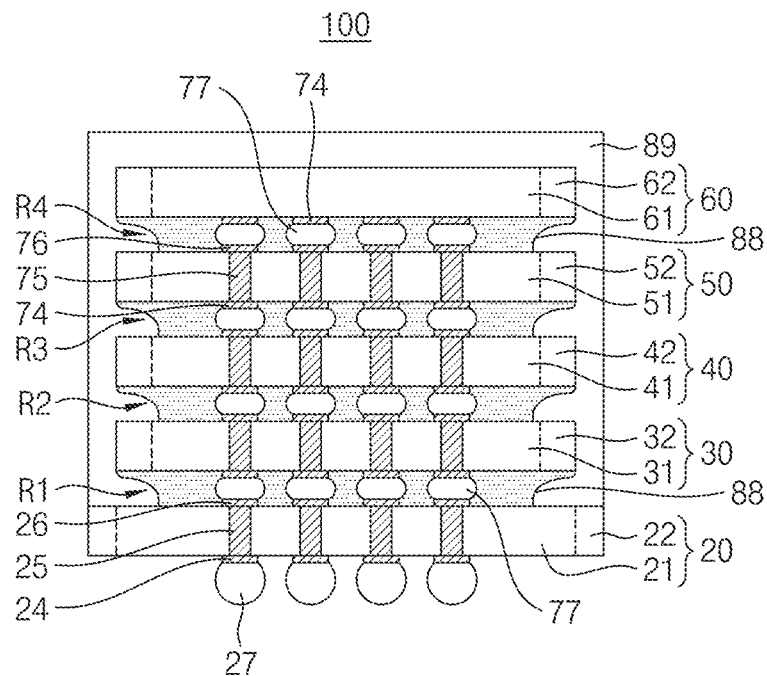

Referring to FIG. 11, each of a plurality of recess regions R1, R2, R3, and R4 may include various surface shapes. In some example embodiments, each of the plurality of recess regions R1, R2, R3, and R4 may include a concave side surface.

Figure 12:
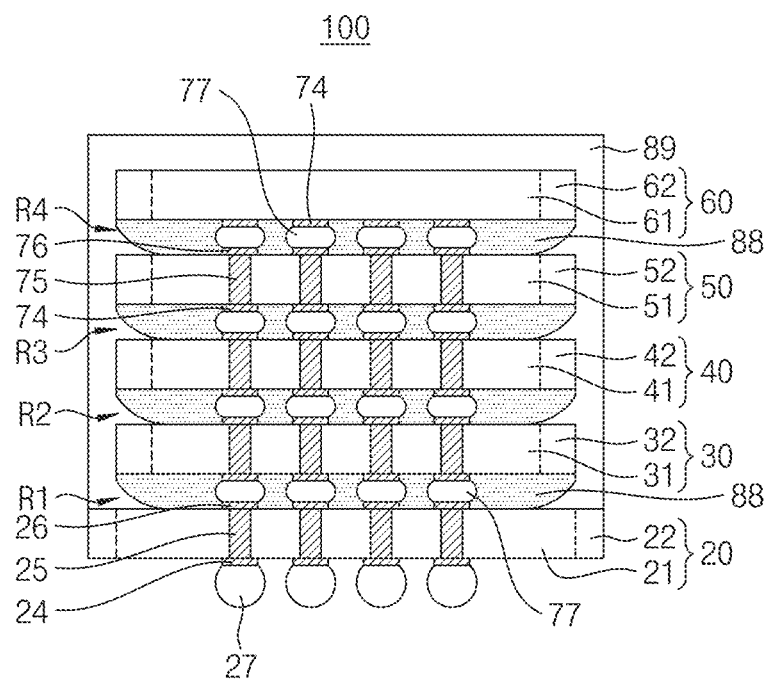

Referring to FIG. 12, each of a plurality of recess regions R1, R2, R3, and R4 may include various surface shapes. In some example embodiments, each of the plurality of recess regions R1, R2, R3, and R4 may include a convex side surface.

FIGS. 13, 14, 15, 16, 17, 18, 19, and 20 are sectional views explaining semiconductor package formation methods according to some example embodiments of the inventive concepts.

Figure 13:
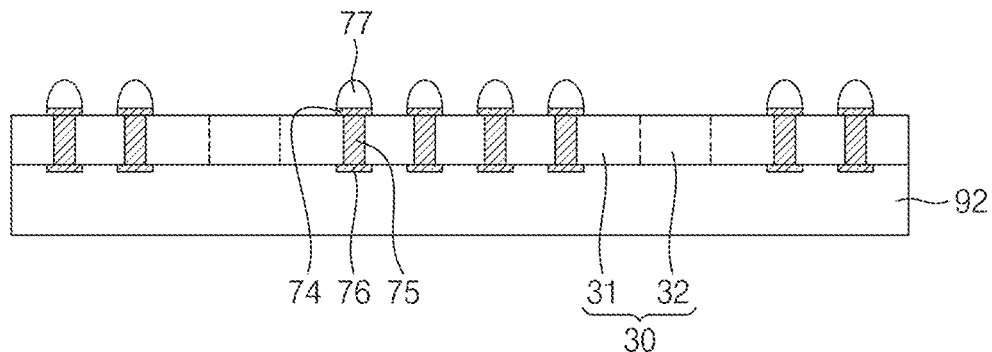
FIGS. 13, 14, 15, 16, 17, 18, 19, 20, 21, 22, 23, 24, 25, 26, 27, 28, 29, 30, 31, 32, 33, 34, 35, and 36 are sectional views explaining semiconductor package formation methods according to some example embodiments of the inventive concepts.

Referring to FIG. 13, a plurality of first semiconductor chips 30 may be provided on a first carrier 92. Each of the plurality of first semiconductor chips 30 may include a first active region 31 and a first scribe lane 32. The first scribe lane 32 may be in continuity with an edge of the first active region 31. The first active region 31 and the first scribe lane 32 may be alternately repeatedly arranged in plural.

The first carrier 92 may include a dicing tape, a backgrind tape, a lamination tape, a carrier tape, or any combination thereof. A plurality of through electrodes 75 may be formed in the first active region 31. A plurality of chip pads 74 may be formed on the first active region 31. A plurality of connecting pads 76 may be formed on a bottom of the first active region 31. The plurality of through electrodes 75 may contact the plurality of chip pads 74 and the plurality of connecting pads 76 while extending through the first active region 31. A plurality of connecting members 77 may be formed on the plurality of chip pads 74.

Figure 14:
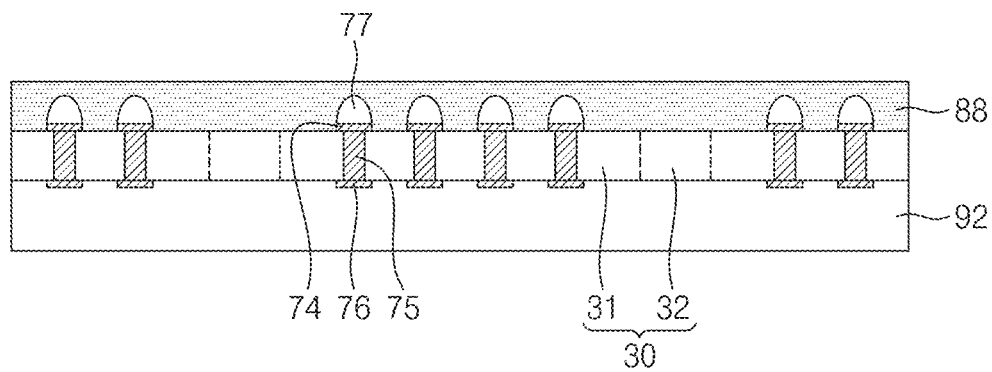

Referring to FIG. 14, a non-conductive film (NCF) 88 may be attached to the plurality of first semiconductor chips 30 in plan view. Attachment of the non-conductive film (NCF) 88 to the plurality of first semiconductor chips 30 may include a vacuum suction process. The non-conductive film (NCF) 88 may cover the plurality of connecting members 77. The plurality of connecting members 77 may extend into the non-conductive film (NCF) 88. The non-conductive film (NCF) 88 may directly contact the first active region 31 and the first scribe lane 32 in plan view.

Figure 15:
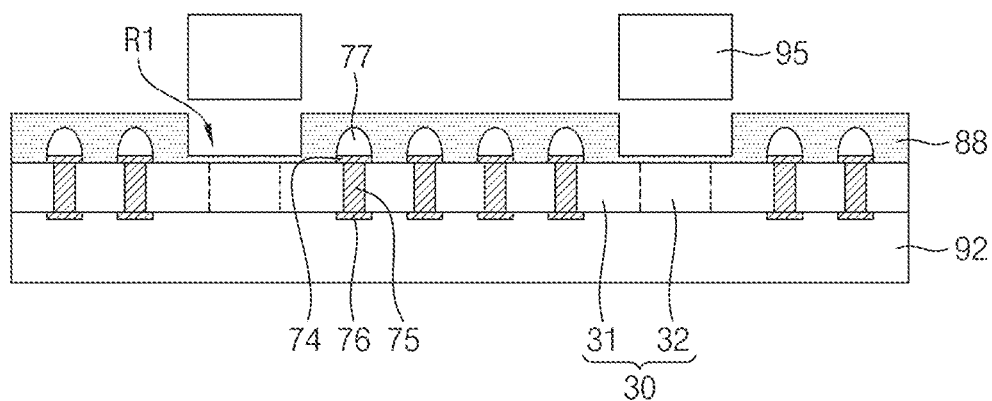

Referring to FIG. 15, the non-conductive film (NCF) 88 may be partially removed, thereby forming a plurality of first recess regions R1. A cutting process using a first blade 95 may be used for removal of the non-conductive film (NCF) 88. Each of the plurality of first recess regions R1 may exhibit various shapes in accordance with the shape and operation method of the first blade 95. Each of the plurality of first recess regions R1 may be aligned on the first scribe lane 32. Each of the plurality of first recess regions R1 may overlap with the first scribe lane 32 in plan view. Each of the plurality of first recess regions R1 may extend on the first active region 31. Each of the plurality of first recess regions R1 may be formed to be spaced apart from the plurality of connecting members 77 by a distance greater than half of a first minimum distance between an edge of the first active region 31 and the plurality of connecting members 77.

Figure 16:
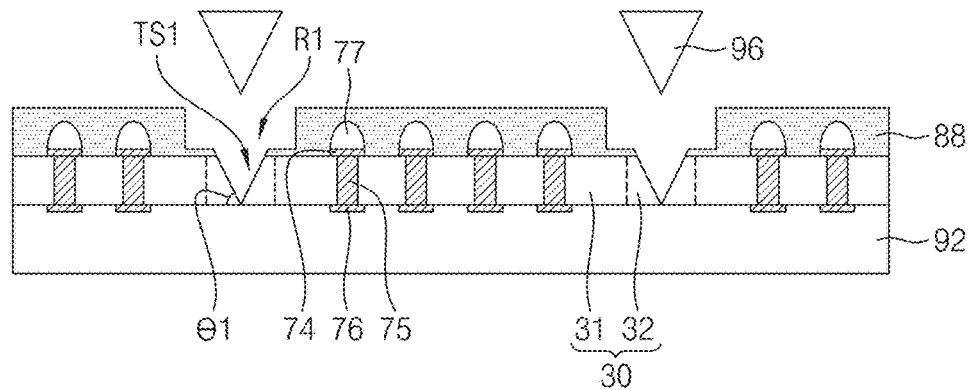

Referring to FIG. 16, the first scribe lane 32 may be cut, thereby separating the plurality of first semiconductor chips 30 from one another. A dicing process using a second blade 96 may be used in the process of cutting the first scribe lane 32, thereby separating the plurality of first semiconductor chips 30 from one another. The dicing process using the second blade 96 may include a bevel cut process.

Each of the plurality of first semiconductor chips 30 may be formed to include a first tilt side surface TS1. The first tilt side surface TS1 may be defined within the first scribe lane 32. A tilt angle θ1 formed by a bottom surface of each of the plurality of first semiconductor chips 30 and the first tilt side surface TS1 may be about 45 degrees to about 89 degrees. The non-conductive film (NCF) 88 may be cut during execution of the process of cutting the first scribe lane 32, thereby separating the plurality of first semiconductor chips 30 from one another. The first tilt side surface TS1 may extend on the non-conductive film (NCF) 88. A side surface of the non-conductive film (NCF) 88 may include tilts of two types.

Figure 17:
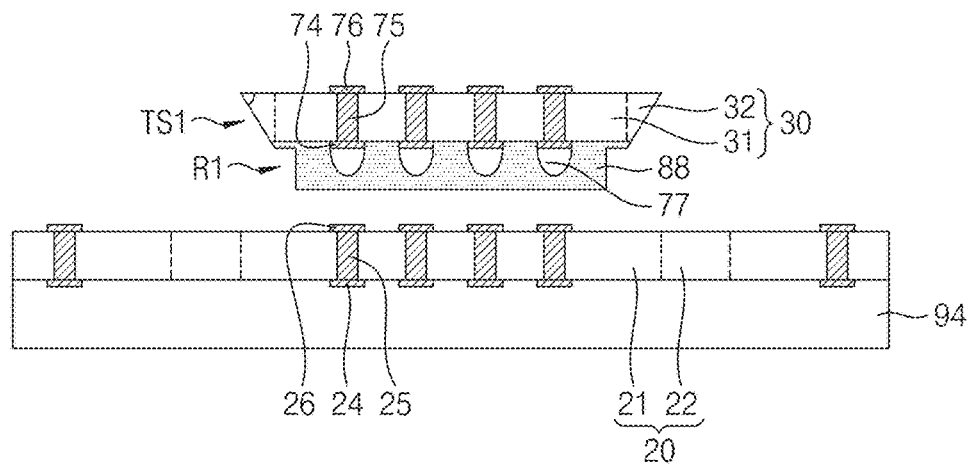

Referring to FIG. 17, a plurality of first substrates 20 may be provided on a second carrier 94. Each of the plurality of first substrates 20 may include a substrate active region 21 and a scribe lane 22. The scribe lane 22 may be in continuity with an edge of the substrate active region 21. The substrate active region 21 and the scribe lane 22 may be alternately repeatedly arranged in plural.

The second carrier 94 may include a dicing tape, a backgrind tape, a lamination tape, a carrier tape, or any combination thereof. A plurality of substrate wirings 25 may be formed in the substrate active region 21. A plurality of upper pads 26 may be formed on the substrate active region 21. A plurality of lower pads 24 may be formed on a bottom surface of the substrate active region 21. The plurality of substrate wirings 25 may contact the plurality of lower pads 24 and the plurality of upper pads 26 while extending through the substrate active region 21. A selected one of the plurality of first semiconductor chips 30 may be aligned on the substrate active region 21 in a vertically inverted state.

Figure 18:
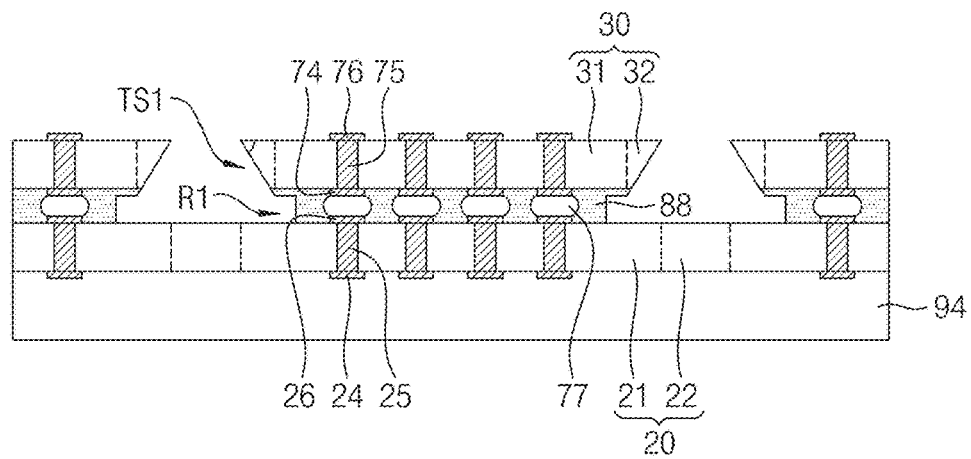

Referring to FIG. 18, the plurality of first semiconductor chips 30 may be attached to the plurality of first substrates 20 in plan view. Attachment of the plurality of first semiconductor chips 30 to the plurality of first substrates 20 may include a thermocompression bonding (TCB) process. The non-conductive film (NCF) 88 may be attached to the substrate active region 21 in plan view. The plurality of connecting members 77 may contact the plurality of upper pads 26 in plan view while extending through the non-conductive film (NCF) 88. The plurality of first recess regions R1 may be re-disposed between the plurality of first substrates 20 and the plurality of first semiconductor chips 30.

Figure 19:
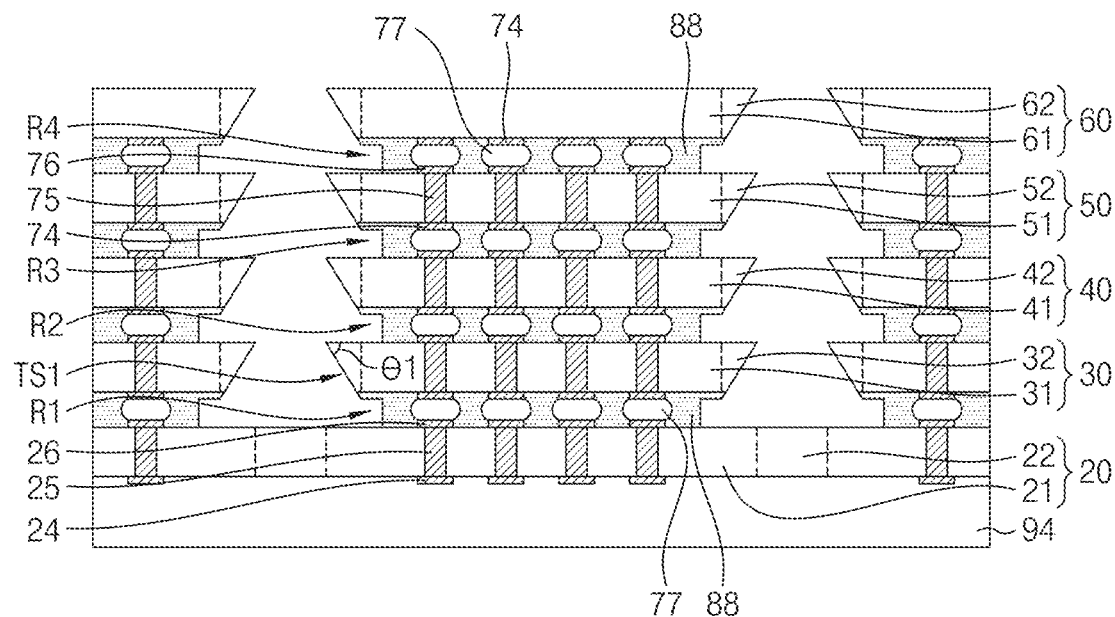

Referring to FIG. 19, a plurality of second semiconductor chips 40, a plurality of third semiconductor chips 50, and a plurality of fourth semiconductor chips 60 may be sequentially attached to the plurality of first semiconductor chips 30 in plan view in accordance with a method similar to the method described with reference to FIGS. 13 to 18.

Figure 20:
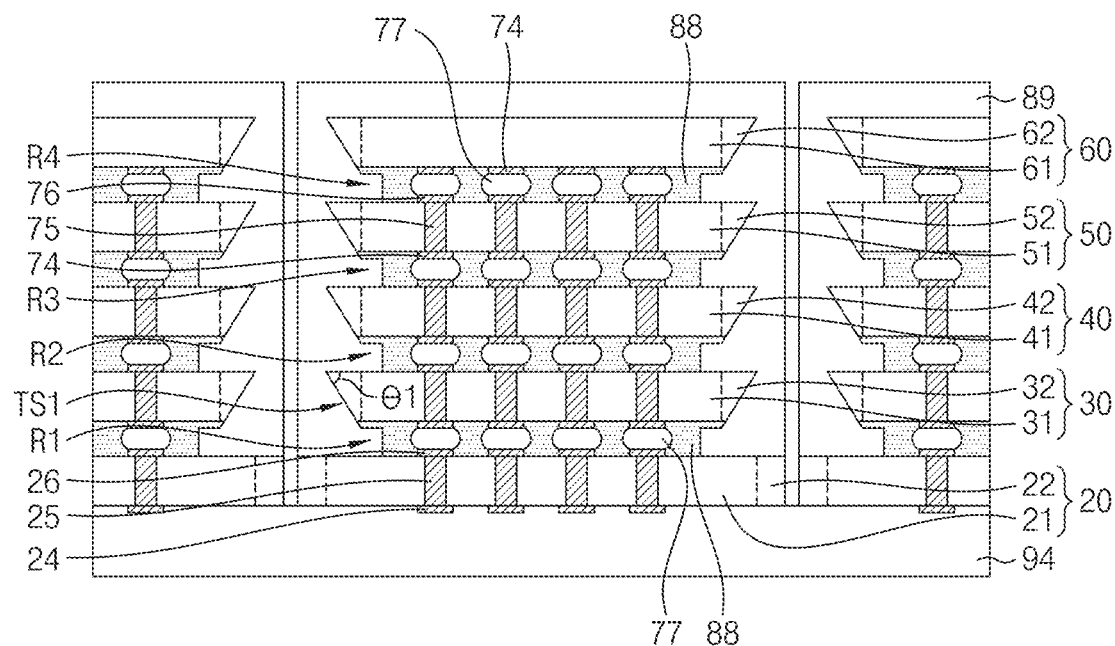

Referring to FIGS. 20 and 1, an encapsulator 89 may be formed on the plurality of first substrates 20, to cover the plurality of first semiconductor chips 30, the plurality of second semiconductor chips 40, the plurality of third semiconductor chips 50, and the plurality of fourth semiconductor chips 60. The encapsulator 89 and the scribe lane 22 may be cut, thereby separating a plurality of first semiconductor packages 100 from one another. The second carrier 94 may be removed, and a plurality of outer terminals 27 may be formed on the plurality of lower pads 24.

Figure 21:
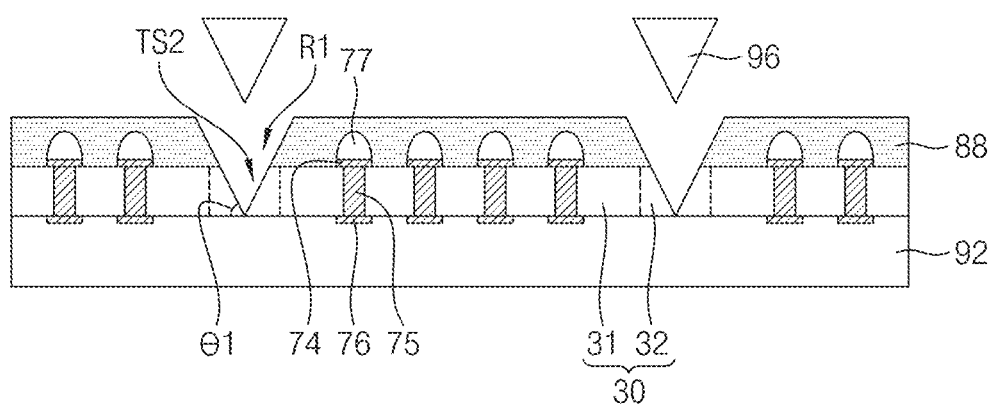
Figure 22:
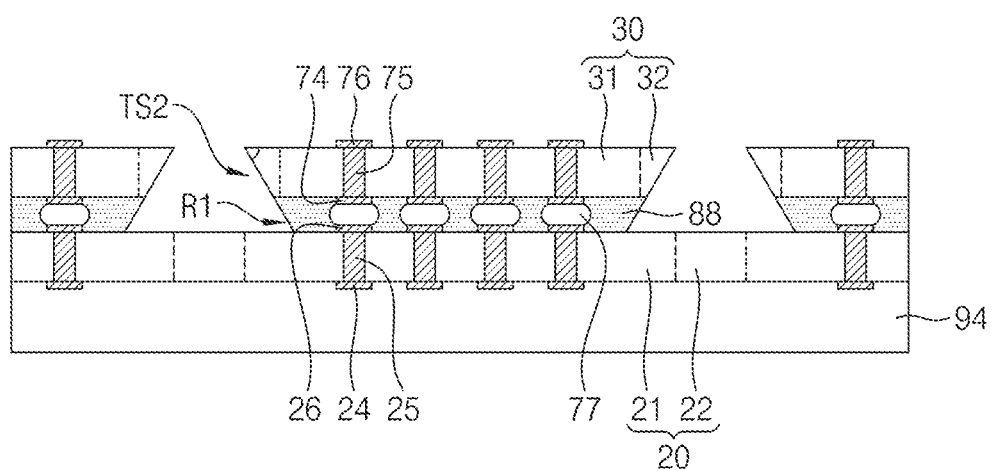
Figure 23:
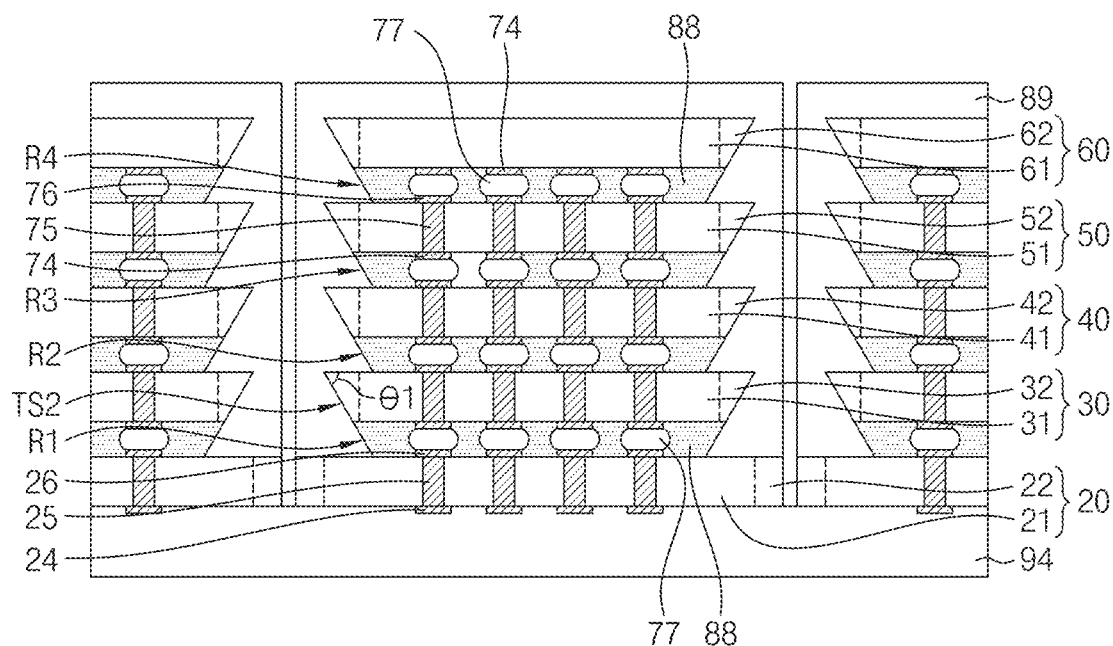

FIGS. 21, 22, and 23 are sectional views explaining semiconductor package formation methods according to some example embodiments of the inventive concepts.

Referring to FIG. 21, a non-conductive film (NCF) 88 and a first scribe lane 32 may be cut, thereby separating a plurality of first semiconductor chips 30 from one another. A dicing process using a second blade 96 may be used in the process of cutting the non-conductive film (NCF) 88 and the first scribe lane 32, thereby separating the plurality of first semiconductor chips 30 from one another. The dicing process using the second blade 96 may include a bevel cut process.

Each of the plurality of first semiconductor chips 30 may be formed to include a second tilt side surface TS2. The second tilt side surface TS2 may be defined within the first scribe lane 32. A tilt angle θ1 formed by a bottom surface of each of the plurality of first semiconductor chips 30 and the second tilt side surface TS2 may be about 45 degrees to about 89 degrees. A plurality of first recess regions R1 may be formed on side surfaces of the non-conductive film (NCF) 88. The second tilt side surface TS2 may extend on the non-conductive film (NCF) 88.

Referring to FIG. 22, the plurality of first semiconductor chips 30 may be attached to a plurality of first substrates 20 in plan view. Attachment of the plurality of first semiconductor chips 30 to the plurality of first substrates 20 may include a thermocompression bonding (TCB) process. A plurality of connecting members 77 may contact the plurality of upper pads 26 in plan view while extending through the non-conductive film (NCF) 88. The plurality of first recess regions R1 may be re-disposed between the plurality of first substrates 20 and the plurality of first semiconductor chips 30.

Referring to FIGS. 23 and 5, a plurality of second semiconductor chips 40, a plurality of third semiconductor chips 50, and a plurality of fourth semiconductor chips 60 may be sequentially attached to the plurality of first semiconductor chips 30 in plan view in accordance with a method similar to the method described with reference to FIGS. 21 and 22. An encapsulator 89 may be formed on the plurality of first substrates 20, to cover the plurality of first semiconductor chips 30, the plurality of second semiconductor chips 40, the plurality of third semiconductor chips 50, and the plurality of fourth semiconductor chips 60. The encapsulator 89 and the scribe lane 22 may be cut, thereby separating a plurality of first semiconductor packages 100 from one another. A second carrier 94 may be removed, and a plurality of outer terminals 27 may be formed on a plurality of lower pads 24.

Figure 24:
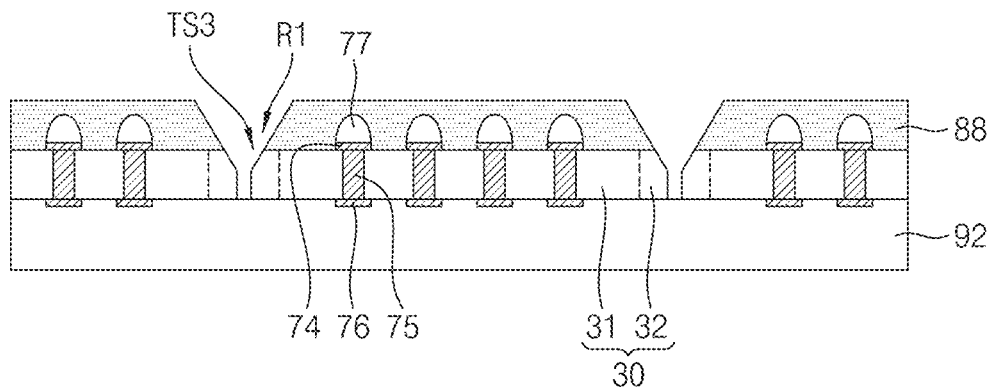
Figure 25:
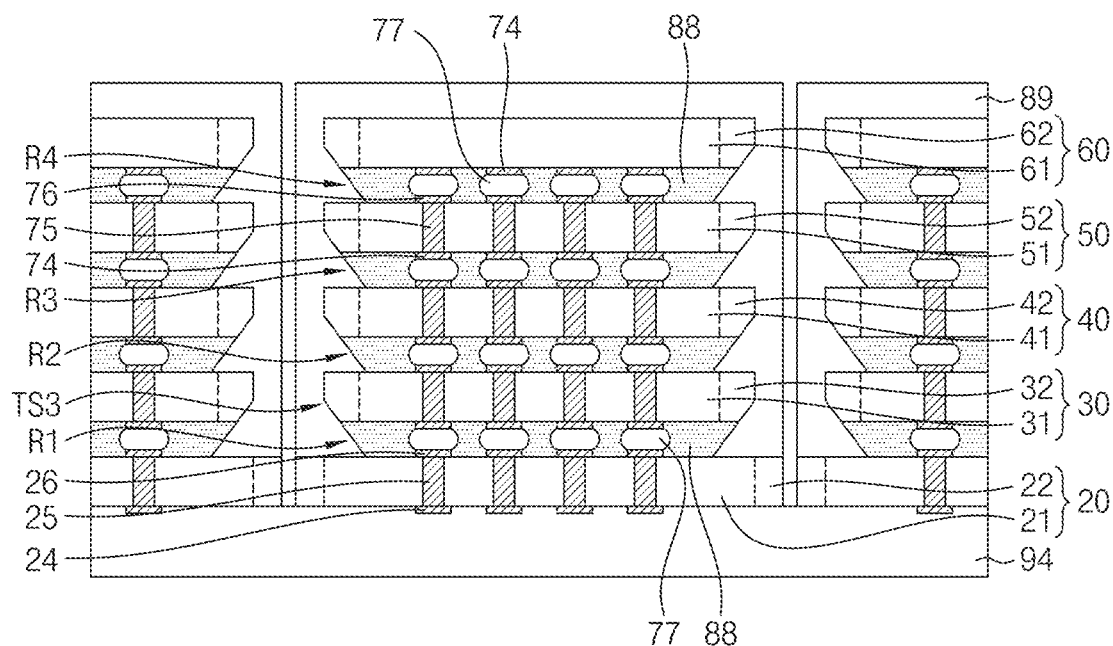

FIGS. 24 and 25 are sectional views explaining semiconductor package formation methods according to some example embodiments of the inventive concepts.

Referring to FIG. 24, a non-conductive film (NCF) 88 and a first scribe lane 32 may be cut, thereby separating a plurality of first semiconductor chips 30 from one another. Various kinds of dicing processes may be used in the process of cutting the non-conductive film (NCF) 88 and the first scribe lane 32, thereby separating the plurality of first semiconductor chips 30 from one another. In some example embodiments, the process of cutting the non-conductive film (NCF) 88 and the first scribe lane 32, thereby separating the plurality of first semiconductor chips 30 from one another, may include a bevel cut process, a laser sawing process, a blade sawing process, or any combination thereof.

Each of the plurality of first semiconductor chips 30 may be formed to include a third tilt side surface TS3. The third tilt side surface TS3 may be defined within the first scribe lane 32. The third tilt side surface TS3 may be formed at an upper edge of each of the plurality of first semiconductor chips 30. A plurality of first recess regions R1 may be formed on side surfaces of the non-conductive film (NCF) 88. The third tilt side surface TS3 may extend on the side surfaces of the non-conductive film (NCF) 88.

Referring to FIGS. 25 and 6, the plurality of first semiconductor chips 30, a plurality of second semiconductor chips 40, a plurality of third semiconductor chips 50, and a plurality of fourth semiconductor chips 60 may be sequentially attached to a plurality of first substrates 20 in plan view in accordance with a method similar to the method described with reference to FIGS. 22 and 23. An encapsulator 89 may be formed on the plurality of first substrates 20, to cover the plurality of first semiconductor chips 30, the plurality of second semiconductor chips 40, the plurality of third semiconductor chips 50, and the plurality of fourth semiconductor chips 60. The encapsulator 89 and the scribe lane 22 may be cut, thereby separating a plurality of first semiconductor packages 100 from one another. A second carrier 94 may be removed, and a plurality of outer terminals 27 may be formed on a plurality of lower pads 24.

Figure 26:
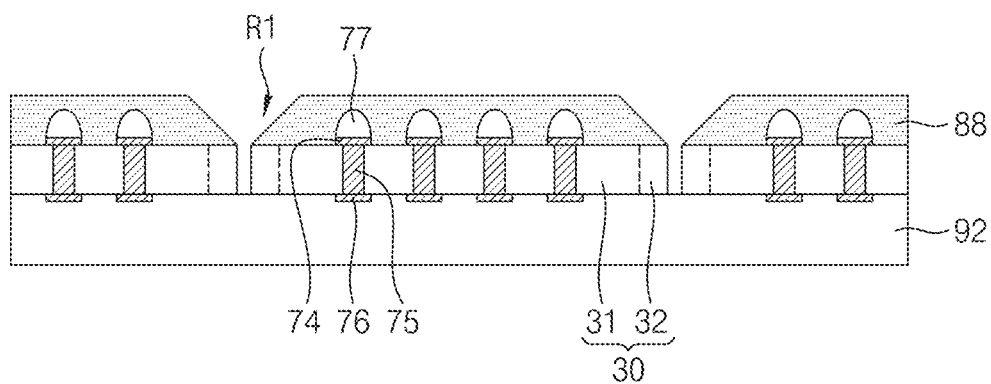
Figure 27:
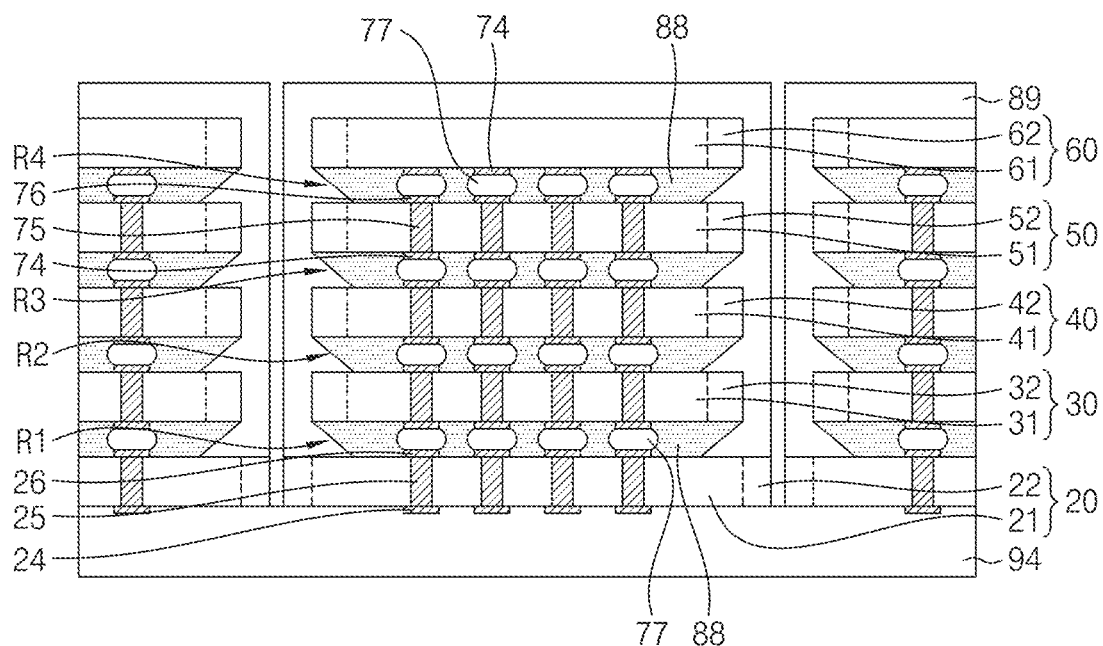

FIGS. 26 and 27 are sectional views explaining semiconductor package formation methods according to some example embodiments of the inventive concepts.

Referring to FIG. 26, a non-conductive film (NCF) 88 and a first scribe lane 32 may be cut, thereby separating a plurality of first semiconductor chips 30 from one another. Various kinds of dicing processes may be used in the process of cutting the non-conductive film (NCF) 88 and the first scribe lane 32, thereby separating the plurality of first semiconductor chips 30 from one another. In some example embodiments, the process of cutting the non-conductive film (NCF) 88 and the first scribe lane 32, thereby separating the plurality of first semiconductor chips 30 from one another, may include a bevel cut process, a laser sawing process, a blade sawing process, or any combination thereof.

Each of the plurality of first semiconductor chips 30 may be formed to include a substantially vertical side surface. A plurality of first recess regions R1 may be formed on side surfaces of the non-conductive film (NCF) 88. The plurality of non-conductive films (NCFs) 88 may include a tilt side surface.

Referring to FIGS. 27 and 7, the plurality of first semiconductor chips 30, a plurality of second semiconductor chips 40, a plurality of third semiconductor chips 50, and a plurality of fourth semiconductor chips 60 may be sequentially attached to a plurality of first substrates 20 in plan view in accordance with a method similar to the method described with reference to FIG. 25. An encapsulator 89 may be formed on the plurality of first substrates 20, to cover the plurality of first semiconductor chips 30, the plurality of second semiconductor chips 40, the plurality of third semiconductor chips 50, and the plurality of fourth semiconductor chips 60. The encapsulator 89 and the scribe lane 22 may be cut, thereby separating a plurality of first semiconductor packages 100 from one another. A second carrier 94 may be removed, and a plurality of outer terminals 27 may be formed on a plurality of lower pads 24.

Figure 28:
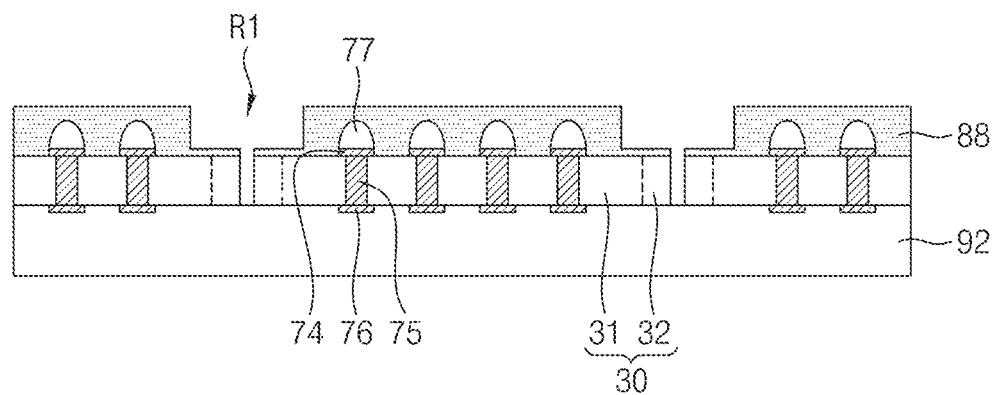
Figure 29:
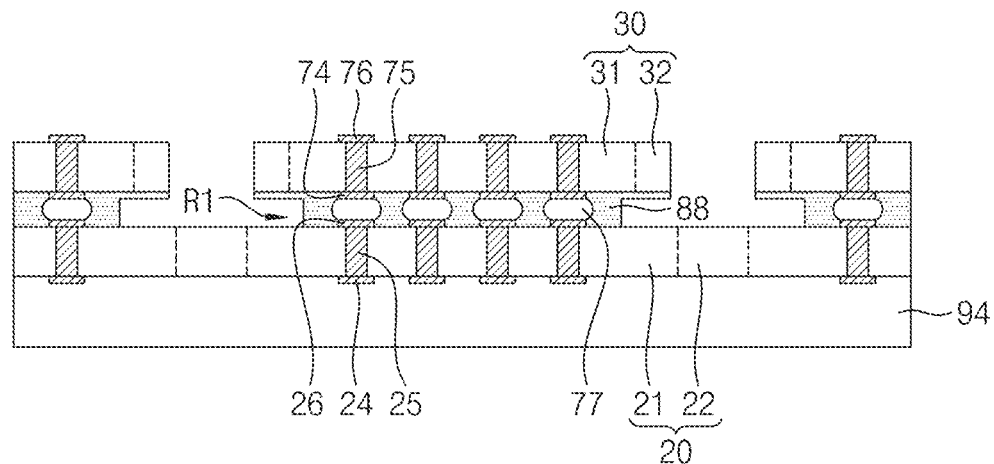
Figure 30:
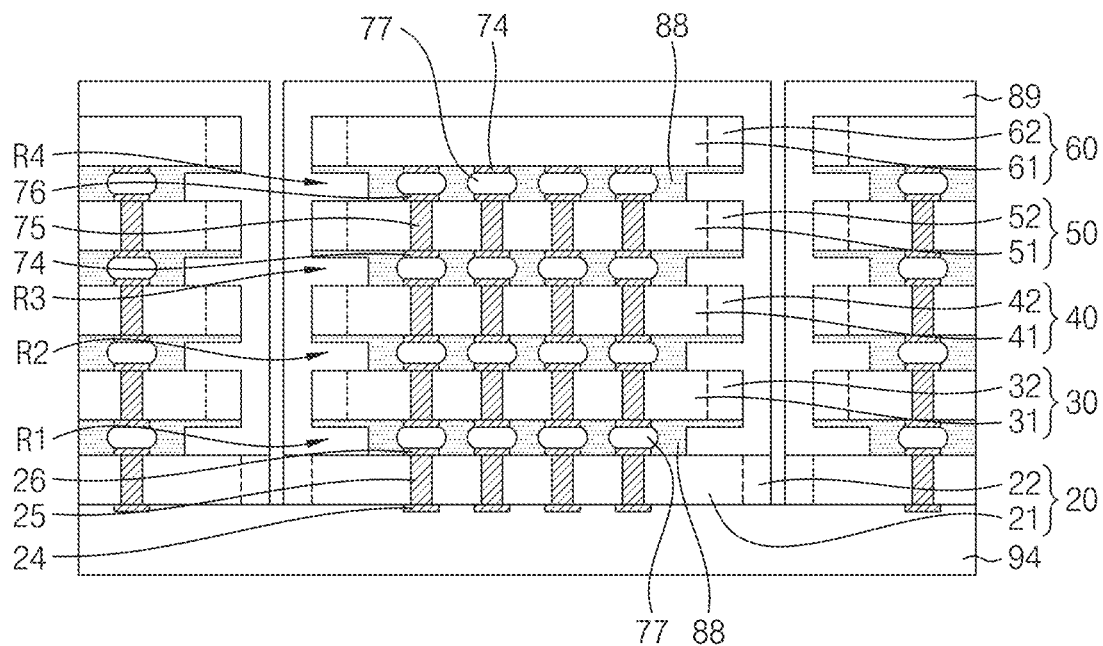

FIGS. 28, 29, and 30 are sectional views explaining semiconductor package formation methods according to some example embodiments of the inventive concepts.

Referring to FIG. 28, a non-conductive film (NCF) 88 and a first scribe lane 32 may be cut, thereby separating a plurality of first semiconductor chips 30 from one another. Various kinds of dicing processes may be used in the process of cutting the non-conductive film (NCF) 88 and the first scribe lane 32, thereby separating the plurality of first semiconductor chips 30 from one another. In some example embodiments, the process of cutting the non-conductive film (NCF) 88 and the first scribe lane 32, thereby separating the plurality of first semiconductor chips 30 from one another, may include a laser sawing process, a blade sawing process, or any combination thereof.

Each of the plurality of first semiconductor chips 30 may be formed to include a substantially vertical side surface. A plurality of first recess regions R1 may be formed on side surfaces of the non-conductive film (NCF) 88. Each of the plurality of first recess regions R1 may include a quadrangular shape or a block shape.

Referring to FIG. 29, the plurality of first semiconductor chips 30 may be attached to a plurality of first substrates 20 in plan view. Attachment of the plurality of first semiconductor chips 30 to the plurality of first substrates 20 may include a thermocompression bonding (TCB) process. A plurality of connecting members 77 may contact a plurality of upper pads 26 in plan view while extending through the non-conductive film (NCF) 88. The plurality of first recess regions R1 may be re-disposed between the plurality of first substrates 20 and the plurality of first semiconductor chips 30.

Referring to FIGS. 30 and 8, a plurality of second semiconductor chips 40, a plurality of third semiconductor chips 50, and a plurality of fourth semiconductor chips 60 may be sequentially attached to the plurality of first semiconductor chips 30 in plan view in accordance with a method similar to the method described with reference to FIGS. 28 and 29. An encapsulator 89 may be formed on the plurality of first substrates 20, to cover the plurality of first semiconductor chips 30, the plurality of second semiconductor chips 40, the plurality of third semiconductor chips 50, and the plurality of fourth semiconductor chips 60. The encapsulator 89 and the scribe lane 22 may be cut, thereby separating a plurality of first semiconductor packages 100 from one another. A second carrier 94 may be removed, and a plurality of outer terminals 27 may be formed on a plurality of lower pads 24.

Figure 31:
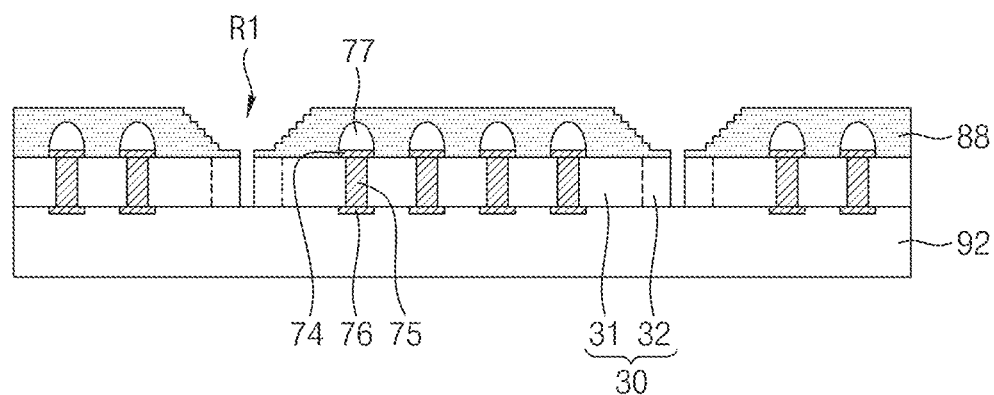
Figure 32:
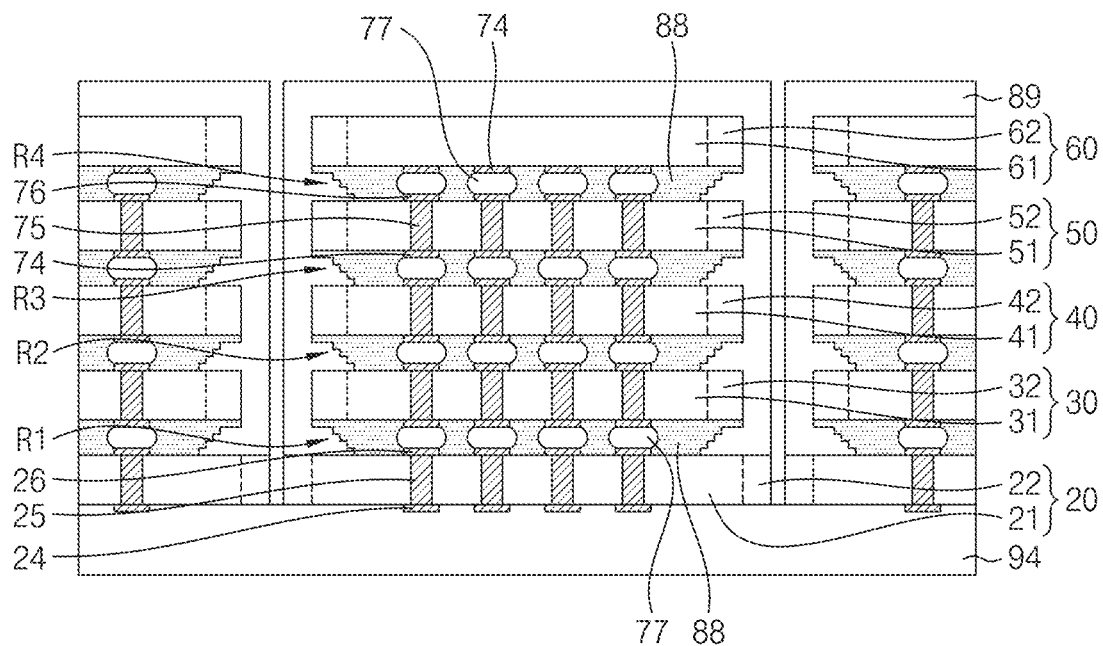

FIGS. 31 and 32 are sectional views explaining semiconductor package formation methods according to some example embodiments of the inventive concepts.

Referring to FIG. 31, a non-conductive film (NCF) 88 and a first scribe lane 32 may be cut, thereby separating a plurality of first semiconductor chips 30 from one another. Various kinds of dicing processes may be used in the process of cutting the non-conductive film (NCF) 88 and the first scribe lane 32, thereby separating the plurality of first semiconductor chips 30 from one another. In some example embodiments, the process of cutting the non-conductive film (NCF) 88 and the first scribe lane 32, thereby separating the plurality of first semiconductor chips 30 from one another, may include a laser sawing process, a blade sawing process, or any combination thereof.

Each of the plurality of first semiconductor chips 30 may be formed to include a substantially vertical side surface. A plurality of first recess regions R1 may be formed on side surfaces of the non-conductive film (NCF) 88. The plurality of non-conductive films (NCFs) 88 may include a surface having a staircase shape.

Referring to FIGS. 32 and 9, the plurality of first semiconductor chips 30, a plurality of second semiconductor chips 40, a plurality of third semiconductor chips 50, and a plurality of fourth semiconductor chips 60 may be sequentially attached to a plurality of first substrates 20 in plan view in accordance with a method similar to the method described with reference to FIG. 27. An encapsulator 89 may be formed on the plurality of first substrates 20, to cover the plurality of first semiconductor chips 30, the plurality of second semiconductor chips 40, the plurality of third semiconductor chips 50, and the plurality of fourth semiconductor chips 60. The encapsulator 89 and the scribe lane 22 may be cut, thereby separating a plurality of first semiconductor packages 100 from one another. A second carrier 94 may be removed, and a plurality of outer terminals 27 may be formed on a plurality of lower pads 24.

Figure 33:
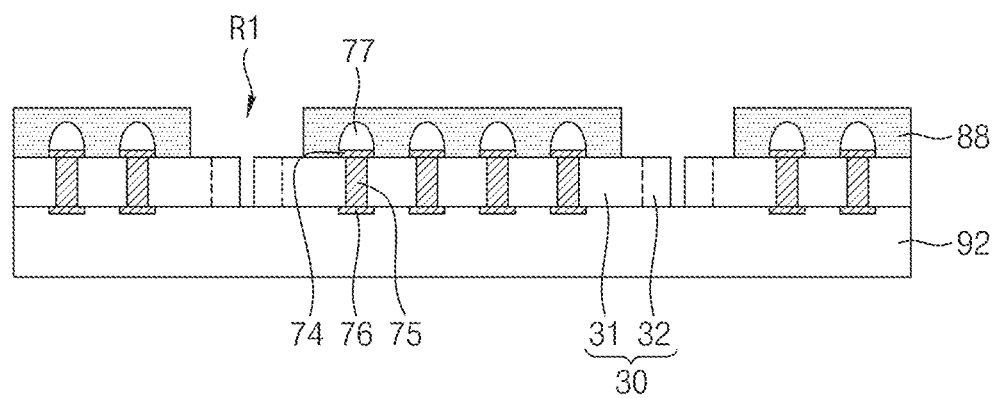
Figure 34:
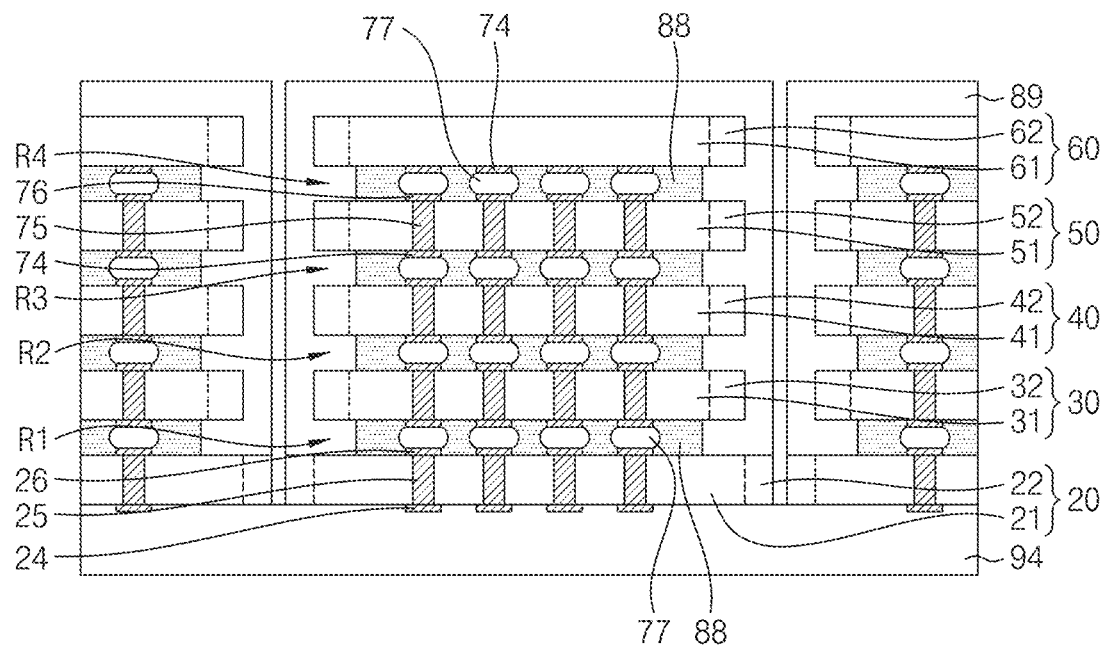

FIGS. 33 and 34 are sectional views explaining semiconductor package formation methods according to some example embodiments of the inventive concepts.

Referring to FIG. 33, a non-conductive film (NCF) 88 and a first scribe lane 32 may be cut, thereby separating a plurality of first semiconductor chips 30 from one another. Various kinds of dicing processes may be used in the process of cutting the non-conductive film (NCF) 88 and the first scribe lane 32, thereby separating the plurality of first semiconductor chips 30 from one another. In some example embodiments, the process of cutting the non-conductive film (NCF) 88 and the first scribe lane 32, thereby separating the plurality of first semiconductor chips 30 from one another, may include a laser sawing process, a blade sawing process, or any combination thereof.

Each of the plurality of first semiconductor chips 30 may be formed to include a substantially vertical side surface. A plurality of first recess regions R1 may be formed on side surfaces of the non-conductive film (NCF) 88. Side surfaces of the plurality of non-conductive films (NCFs) 88 may include a vertical wall shape. Top surfaces of the first scribe lane 32 and the first active region 31 may be exposed in the plurality of first recess regions R1.

Referring to FIGS. 34 and 10, the plurality of first semiconductor chips 30, a plurality of second semiconductor chips 40, a plurality of third semiconductor chips 50, and a plurality of fourth semiconductor chips 60 may be sequentially attached to a plurality of first substrates 20 in plan view in accordance with a method similar to the method described with reference to FIG. 32. An encapsulator 89 may be formed on the plurality of first substrates 20, to cover the plurality of first semiconductor chips 30, the plurality of second semiconductor chips 40, the plurality of third semiconductor chips 50, and the plurality of fourth semiconductor chips 60. The encapsulator 89 and the scribe lane 22 may be cut, thereby separating a plurality of first semiconductor packages 100 from one another. A second carrier 94 may be removed, and a plurality of outer terminals 27 may be formed on a plurality of lower pads 24.

Figure 35:
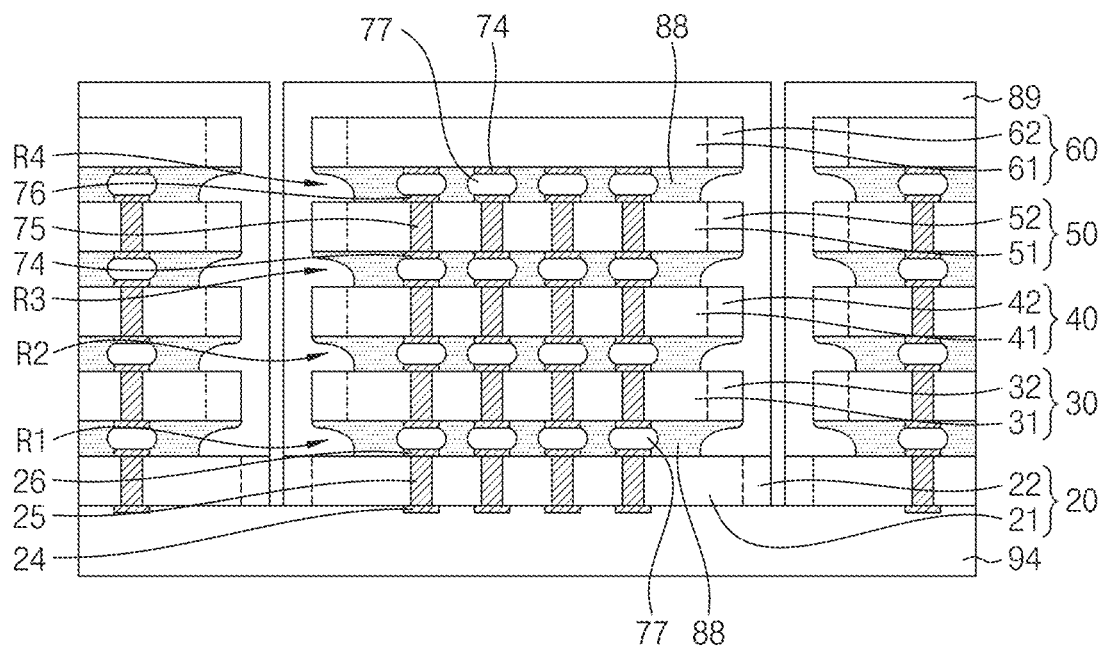

FIG. 35 is a sectional view explaining semiconductor package formation methods according to some example embodiments of the inventive concepts.

Referring to FIGS. 35 and 11, each of the plurality of recess regions R1, R2, R3, and R4 may be formed to include a concave side surface.

Figure 36:
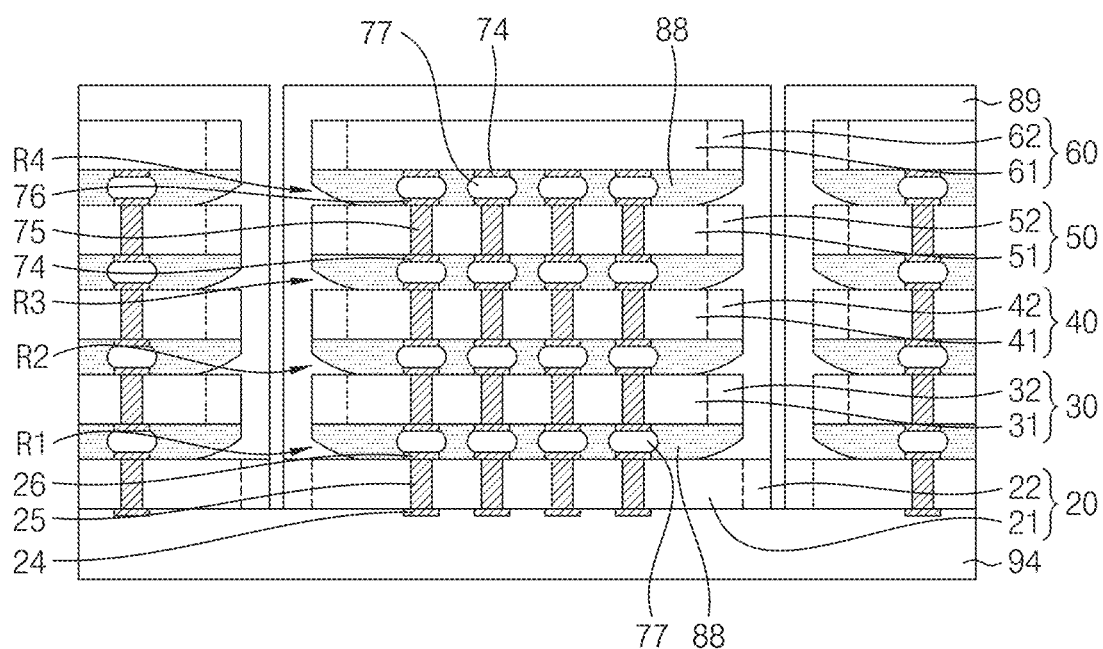

FIG. 36 is a sectional view explaining semiconductor package formation methods according to some example embodiments of the inventive concepts.

Referring to FIGS. 36 and 12, each of the plurality of recess regions R1, R2, R3, and R4 may be formed to include a convex side surface.

Figure 37:
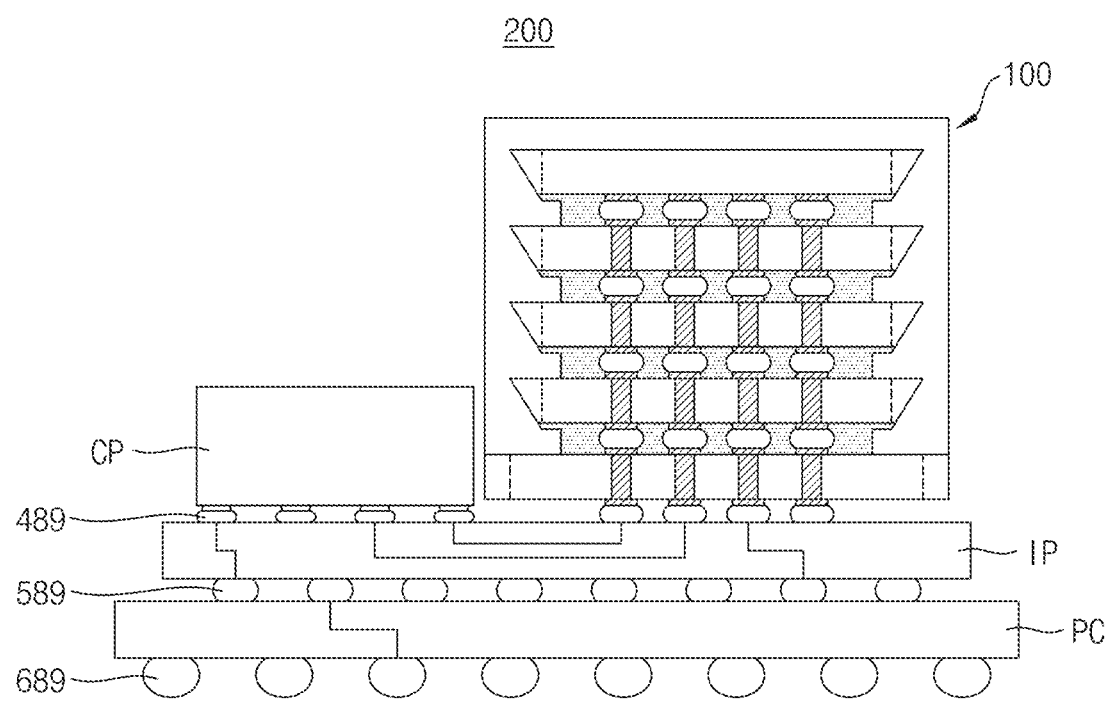
FIG. 37 is a sectional view explaining a second semiconductor package according to some example embodiments of the inventive concepts.

FIG. 37 is a sectional view explaining a second semiconductor package 200 according to some example embodiments of the inventive concepts. The second semiconductor package 200 according to some example embodiments of the inventive concepts may include a high bandwidth memory (HBM), a hybrid memory cube (HMC), a double data rate fifth-generation (DDR5) DRAM, or any combination thereof. The second semiconductor package 200 according to some example embodiments of the inventive concepts may include a package-on-package (PoP).

Referring to FIG. 37, the second semiconductor package 200 according to some example embodiments of the inventive concepts may include a printed circuit board PC, a relay board IP, a first semiconductor package 100, a third semiconductor package CP, and a plurality of bumps 489, 589 and 689. The first semiconductor package 100 may include a configuration similar to the configuration described with reference to FIGS. 1 to 35. In some example embodiments, the first semiconductor package 100 may include the first substrate 20, the plurality of lower pads 24, the plurality of substrate wirings 25, the plurality of upper pads 26, the plurality of outer terminals 27, the plurality of semiconductor chips 30, 40, 50 and 60, the plurality of connecting members 77, the plurality of non-conductive films (NCFs) 88, and the encapsulator 89. In some example embodiments, the third semiconductor package CP may include at least one semiconductor chip. The third semiconductor package CP may include a microprocessor, a logic chip, an application processor, a graphics processing unit, a buffer chip, or any combination thereof.

The first substrate 20 may be referred to as a second or third substrate, the printed circuit board PC may be referred to as a first, second or third substrate, and the relay board IP may be referred to as a first, second or third substrate. The plurality of bumps 489, 589, and 689 may include a plurality of first bumps 489, a plurality of second bumps 589, and a plurality of third bumps 689.

The printed circuit board PC may include a rigid printed circuit board, a flexible printed circuit board, or a rigid-flexible printed circuit board. The printed circuit board PC may include a multilayer circuit board. The printed circuit board PC may correspond to a package substrate or a main board. The plurality of third bumps 689 may be disposed at a bottom surface of the printed circuit board PC. The relay board IP may be disposed on the printed circuit board PC. The plurality of second bumps 589 may be disposed between the printed circuit board PC and the relay board IP.

The first semiconductor package 100 and the third semiconductor package CP may be disposed on the relay board IP. The relay board IP may include a semiconductor substrate such as a silicon interposer. The plurality of first bumps 489 may be disposed between the third semiconductor package CP and the relay board IP. The plurality of outer terminals 27 may be connected to the relay board IP. The first semiconductor package 100 may be electrically connected to the third semiconductor package CP via the relay board IP and the plurality of first bumps 489.

In some example embodiments, the first substrate 20 may include a buffer chip, a logic chip, or any combination thereof. Each of the plurality of semiconductor chips 30, 40, 50, and 60 may correspond to a DRAM core chip. In some example embodiments, the first semiconductor chip 30 may correspond to a master chip. Each of the second semiconductor chip 40, the third semiconductor chip 50, and the fourth semiconductor chip 60 may correspond to a slave chip.

In accordance with some example embodiments of the inventive concepts, a non-conductive film (NCF), which is disposed between a substrate and a semiconductor chip, and includes a recess region, may be provided. The recess region may overlap with a scribe lane in plan view, and may extend on an active region. The recess region may function to control fillet formation of the non-conductive film (NCF). A semiconductor package advantageous in increasing mass production efficiency while having excellent reliability may be realized.

Any of the devices, elements, boards, blocks, IPs, chips, memories, units, packages, or the like as described herein may be included in, include, and/or implement one or more instances of processing circuitry such as hardware including logic circuits, a hardware/software combination such as a processor executing software; or any combination thereof. In some example embodiments, said one or more instances of processing circuitry may include, but are not limited to, a central processing unit (CPU), an application processor (AP), an arithmetic logic unit (ALU), a graphic processing unit (GPU), a digital signal processor, a microcomputer, a field programmable gate array (FPGA), a System-on-Chip (SoC) a programmable logic unit, a microprocessor, or an application-specific integrated circuit (ASIC), etc. In some example embodiments, any of the memories as described herein may include a non-transitory computer readable storage device, for example a solid state drive (SSD), storing a program of instructions, and the one or more instances of processing circuitry may be configured to execute the program of instructions to implement the functionality of some or all of the devices, elements, boards, blocks, IPs, units, packages, or the like as described herein, or the like according to any of the example embodiments as described herein.

While some example embodiments of the inventive concepts have been described with reference to the accompanying drawings, it should be understood by those skilled in the art that various modifications may be made without departing from the scope of the inventive concepts and without changing essential features thereof. Therefore, the above-described example embodiments should be considered in a descriptive sense only and not for purposes of limitation.

What is claimed is:

1. A semiconductor package, comprising:
    a substrate;
    a semiconductor chip on the substrate, the semiconductor chip having a tilted side surface and including
        an active region, and
        a scribe lane in continuity with an edge of the active region; and
    a non-conductive film (NCF) between the substrate and the semiconductor chip, overlapping the active region and a part of the scribe lane and not overlapping a remaining part of the scribe lane.

2. The semiconductor package according to claim 1, wherein the non-conductive film (NCF) includes an upper surface in contact with the semiconductor chip, a lower surface in contact with the substrate, and a side surface between the upper surface and the lower surface, and the side surface has a convex portion.

3. The semiconductor package according to claim 2, wherein the convex portion of the side surface of the non-conductive film (NCF) does not overlap the active region of the semiconductor chip.

4. The semiconductor package according to claim 2, wherein the convex portion of the side surface of the non-conductive film (NCF) covers at least a portion of the tilted side surface of the semiconductor chip.

5. The semiconductor package according to claim 2, wherein the convex portion of the side surface of the non-conductive film (NCF) covers a height of less than ½ of the tilted side surface of the semiconductor chip.

6. The semiconductor package according to claim 2, wherein a maximum thickness of the convex portion of the side surface is greater than a thickness of a portion of the non-conductive film (NCF) disposed between the substrate and the active region of the semiconductor chip.

7. The semiconductor package according to claim 1, wherein the non-conductive film (NCF) has a smaller horizontal width than a horizontal width of the semiconductor chip.

8. The semiconductor package according to claim 1, wherein an area of the non-conductive film (NCF) is smaller than an area of an upper surface of the semiconductor chip and larger than an area of a lower surface of the semiconductor chip facing the non-conductive film (NCF).

9. The semiconductor package according to claim 8, wherein a tilt angle formed by the upper surface of the semiconductor chip and the tilted side surface is about 45 degrees to about 89 degrees.

10. The semiconductor package according to claim 2, further comprising:
    a plurality of connecting members connected to the substrate and the semiconductor chip while extending within the non-conductive film (NCF).

11. The semiconductor package according to claim 10, wherein the convex portion of the side surface is spaced apart from the plurality of connecting members.

12. The semiconductor package according to claim 10, wherein each of the plurality of connecting members comprises a conductive bump, a conductive ball, a conductive pin, a conductive lead, a conductive pillar, or any combination thereof.

13. The semiconductor package according to claim 2, further comprising:
an encapsulator on the substrate and covering the tilted side surface of the semiconductor chip,
wherein the encapsulator is in direct contact with the convex portion of the side surface of the non-conductive film (NCF).

14. The semiconductor package according to claim 13, wherein at least a portion of the encapsulator overlaps with both a portion of the substrate and a portion of the scribe lane.

15. A semiconductor package, comprising:
a substrate;
semiconductor chips on the substrate, each of the semiconductor chips having a tilted side surface and including
an active region, and
a scribe lane in continuity with an edge of the active region;
non-conductive films (NCFs) among the semiconductor chips and between the substrate and the semiconductor chips; and
a plurality of connecting members among the semiconductor chips and between the substrate and the semiconductor chips, the plurality of connecting members being connected to the substrate and the semiconductor chips while extending in the non-conductive films (NCFs),
wherein each of the non-conductive films (NCFs) overlaps the active region of the semiconductor chips and a part of the scribe lane and does not overlap a remaining part of the scribe lane in plan view.

16. The semiconductor package according to claim 15, wherein each of the non-conductive films (NCFs) includes
an upper surface in contact with one of the semiconductor chips,
a lower surface in contact with another one of the semiconductor chips or the substrate, and
a side surface between the upper surface and the lower surface, and the side surface has a convex portion.

17. The semiconductor package according to claim 16, wherein the convex portion of the side surface of each of the non-conductive films (NCFs) does not overlap the active region of the semiconductor chips.

18. The semiconductor package according to claim 15, wherein:
an upper surface of each of the semiconductor chips has a greater horizontal width than a lower surface of each of the semiconductor chips; and
a tilt angle formed by the upper surface and the tilted side surface of each of the semiconductor chips is about 45 degrees to about 89 degrees.

19. The semiconductor package according to claim 16, further comprising:
an encapsulator on the substrate and covering the tilted side surface of each of the semiconductor chips,
wherein the encapsulator is in direct contact with the convex portion of the side surface of at least one of the non-conductive films (NCFs), and
wherein the encapsulator at least partially overlaps with both a portion of the substrate and at least a portion of the active region of the semiconductor chips.

20. A semiconductor package comprising:
a first substrate;
a first semiconductor package on the first substrate; and
a second semiconductor package on the first substrate and electrically connected to the first semiconductor package,
wherein the first semiconductor package includes
a second substrate,
semiconductor chips on the second substrate, each of the semiconductor chips including
an active region, and
a scribe lane in continuity with an edge of the active region, the scribe lane having a tilted side surface,
non-conductive films (NCFs) among the semiconductor chips and between the second substrate and the semiconductor chips, and
a plurality of connecting members among the semiconductor chips and between the second substrate and the semiconductor chips, the plurality of connecting members being connected to the second substrate and the semiconductor chips while extending in the non-conductive films (NCFs),
wherein each of the non-conductive films (NCFs) overlaps the active region of the semiconductor chips and a part of the scribe lane and does not overlap a remaining part of the scribe lane in plan view.

* * * * *